(12) United States Patent
Suzuki et al.

(10) Patent No.: US 9,603,245 B2
(45) Date of Patent: Mar. 21, 2017

(54) LITHIUM-ION SECONDARY BATTERY, ELECTRODE FOR THE SECONDARY BATTERY, AND ELECTROLYTIC COPPER FOIL FOR ELECTRODE FOR THE SECONDARY BATTERY

(75) Inventors: Akitoshi Suzuki, Tokyo (JP); Kensaku Shinozaki, Tokyo (JP); Toshio Tani, Tokyo (JP); Hirokazu Sasaki, Tokyo (JP); Isamu Futaba, Tokyo (JP); Kouji Hataya, Tokyo (JP); Shinya Ohtomo, Tokyo (JP); Hirokazu Yoshikawa, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 309 days.

(21) Appl. No.: 13/976,503

(22) PCT Filed: Dec. 27, 2011

(86) PCT No.: PCT/JP2011/080314
§ 371 (c)(1),
(2), (4) Date: Sep. 12, 2013

(87) PCT Pub. No.: WO2012/091060
PCT Pub. Date: Jul. 5, 2012

(65) Prior Publication Data
US 2014/0017564 A1    Jan. 16, 2014

(30) Foreign Application Priority Data
Dec. 27, 2010   (JP) ................................. 2010-290654

(51) Int. Cl.
*H01M 4/66*    (2006.01)
*H05K 1/09*    (2006.01)
(Continued)

(52) U.S. Cl.
CPC .................. *H05K 1/09* (2013.01); *C22F 1/08* (2013.01); *C23C 22/24* (2013.01); *C25D 1/04* (2013.01);
(Continued)

(58) Field of Classification Search
CPC  H01M 4/661; C25D 1/04; C25D 3/38; C25D 5/50
See application file for complete search history.

(56) References Cited

U.S. PATENT DOCUMENTS

2008/0050652 A1 * 2/2008 Hirose ................ H01M 2/0275
  429/200
2009/0280407 A1 * 11/2009 Ito .......................... H01M 4/66
  429/209

(Continued)

FOREIGN PATENT DOCUMENTS

JP    53-039376 B    10/1978
JP    09-306504 A    11/1997
(Continued)

OTHER PUBLICATIONS

Office Communication issued by European Patent Office on Dec. 22, 2015.
(Continued)

*Primary Examiner* — Stewart Fraser
(74) *Attorney, Agent, or Firm* — Kubotera & Associates, LLC

(57) ABSTRACT

To provide an electrolytic copper foil for a negative electrode for a lithium-ion secondary battery with which it is possible to produce a long-life lithium-ion secondary battery in which there is no decline in the capacity retention ratio even when the charge-discharge cycling is repeated, that has long life, and no deformation of a negative electrode current collector occurs. The electrolytic copper foil constituting the
(Continued)

negative electrode current collector for the lithium-ion secondary battery has, after heat treatment at from 200 to 400° C., a 0.2% proof stress of 250 N/mm² or more, and elongation of 2.5% or more; and the surface on which an active material layer of the electrolytic copper foil is provided has been rust-proofed, or roughened and rust-proofed. As a result of analysis of the depth profile (depth direction) obtained by performing secondary ion mass spectrometry (SIMS) in the thickness direction of the copper foil, the copper foil including: chlorine (Cl), carbon (C), and oxygen (O) each in a concentration of $10^{17}$ to $5 \times 10^{20}$ atoms/cm³, and sulfur (S) and nitrogen (N) each in a concentration of $10^{15}$ to $10^{19}$ atoms/cm³.

11 Claims, 6 Drawing Sheets

(51) Int. Cl.
| | |
|---|---|
| *C22F 1/08* | (2006.01) |
| *C25D 3/38* | (2006.01) |
| *C25D 5/48* | (2006.01) |
| *C25D 7/06* | (2006.01) |
| *H01M 4/133* | (2010.01) |
| *H01M 4/134* | (2010.01) |
| *H01M 4/1395* | (2010.01) |
| *H01M 10/0525* | (2010.01) |
| *C23C 22/24* | (2006.01) |
| *C25D 1/04* | (2006.01) |
| *C25D 5/10* | (2006.01) |
| *C25D 5/16* | (2006.01) |
| *H01M 4/04* | (2006.01) |
| *H01M 4/02* | (2006.01) |

(52) U.S. Cl.
CPC ............... *C25D 3/38* (2013.01); *C25D 5/10* (2013.01); *C25D 5/16* (2013.01); *C25D 5/48* (2013.01); *C25D 7/0614* (2013.01); *H01M 4/133* (2013.01); *H01M 4/134* (2013.01); *H01M 4/1395* (2013.01); *H01M 4/661* (2013.01); *H01M 4/667* (2013.01); *H01M 10/0525* (2013.01); *H01M 4/043* (2013.01); *H01M 4/0404* (2013.01); *H01M 4/0471* (2013.01); *H01M 2004/021* (2013.01); *H05K 2201/0355* (2013.01); *H05K 2203/0307* (2013.01); *H05K 2203/1105* (2013.01); *Y02E 60/122* (2013.01); *Y10T 428/12431* (2015.01)

(56) References Cited

U.S. PATENT DOCUMENTS

| | | |
|---|---|---|
| 2010/0136434 A1 | 6/2010 | Hanafusa |
| 2011/0139626 A1 | 6/2011 | Saito et al. |
| 2011/0171491 A1 | 7/2011 | Suzuki et al. |

FOREIGN PATENT DOCUMENTS

| | | | |
|---|---|---|---|
| JP | 10-096088 | A | 4/1998 |
| JP | 2740768 | B | 4/1998 |
| JP | 10-255768 | A | 9/1998 |
| JP | 11-273683 | A | 10/1999 |
| JP | 2001-189154 | A | 7/2001 |
| JP | 2002-083594 | A | 3/2002 |
| JP | 3742144 | B | 2/2006 |
| JP | 2006-152420 | A | 6/2006 |
| JP | 2006-202635 | A | 8/2006 |
| JP | 3850155 | B | 11/2006 |
| JP | 2007-227328 | A | 9/2007 |
| JP | 2009-295599 | A | 12/2009 |
| WO | 2008/132987 | A1 | 11/2008 |
| WO | 2009151124 | A1 | 12/2009 |
| WO | 2010004988 | A1 | 1/2010 |
| WO | 2010/110205 | A1 | 9/2010 |

OTHER PUBLICATIONS

Interntional Search Report for PCT/JP2011/080314, Japanese Patent Office, Apr. 17, 2012.

* cited by examiner

Definition of crystal grain diameter

TEM image of precipitated phases (domains)

STEM image and EELS element analysis
(black portions are precipitated phases or domains of 100 nm or less)

LITHIUM-ION SECONDARY BATTERY, ELECTRODE FOR THE SECONDARY BATTERY, AND ELECTROLYTIC COPPER FOIL FOR ELECTRODE FOR THE SECONDARY BATTERY

TECHNICAL FIELD

The present invention relates to a lithium-ion secondary battery that includes a positive electrode current collector (electrode), a negative electrode with a negative electrode active material layer formed on a surface of a negative electrode current collector, and a non-aqueous electrolyte, an electrode used in the secondary battery, and an electrolytic copper foil and copper foil that constitutes the current collector of the electrode.

BACKGROUND TECHNOLOGY

Lithium-ion secondary batteries that include a positive electrode; a negative electrode in which carbon particles are applied as a negative electrode active material layer to a surface of a negative electrode current collector made from a copper foil whose two sides are flat, dried, and then pressed; and a non-aqueous electrolyte, are currently used in mobile phones and notebook personal computers, and the like. So-called "unprocessed copper foil" that is produced by electrolysis and that has been rust-proofed is used in the negative electrode of the lithium-ion secondary battery.

As disclosed in Patent Document 1 (Japanese Patent No. 3742144), by using a copper foil in which the roughness of the matt surface is reduced thereby reducing the difference in the surface roughness of a glossy surface (S surface) and a matt surface (M surface) and (both surfaces of the copper foil) as the copper foil used as the negative electrode current collector for a lithium-ion secondary battery, the reduction of the charge-discharge efficiency of the secondary battery is suppressed.

Electrolytic copper foil in which the roughness of the matt surface has been reduced as described above to reduce the difference in surface roughness of a first surface (glossy surface, S surface) and a second surface (matt surface, M surface) is produced by appropriately selecting various water soluble polymer substances, various surfactants, various organic sulfur compounds, chloride ions, and the like, and adding them to a copper sulfate-sulfuric acid electrolytic solution.

Patent Document 1 (Japanese Patent No. 3742144) discloses a negative electrode current collector using electrolytic copper foil produced by adding a compound having a mercapto group, chloride ion, low molecular weight glue having a molecular weight of 10000 or less, and polymer polysaccharide to copper sulfate-sulfuric acid electrolytic solution.

Carbon particles were applied to the surface of the electrolytic copper foil produced by the above manufacturing method, dried, and then pressed to produce the negative electrode.

This electrolytic copper foil has a tensile strength of from 300 to 350 N/mm$^2$, and also has an appropriate elongation, so it is a suitable material for use as the copper foil for a negative electrode having carbon particles as the active material.

Patent Document 2 (Japanese Patent No. 3850155) discloses an electrolytic copper foil produced from copper sulfate-sulfuric acid electrolytic solution.

In recent years, lithium-ion secondary batteries using aluminum, silicon, tin, and the like that alloys electrochemically with lithium during charging as the negative electrode active material have been proposed with the objective of increasing the capacity of the lithium-ion secondary battery (see Patent Document 3 (Japanese Unexamined Patent Application Publication No. H10-255768)).

In order to increase the capacity, the electrode (negative electrode) for the lithium-ion secondary battery is formed by laminating silicon as a noncrystalline silicon thin-film or a microcrystalline silicon thin film on the current collector made of copper foil or the like, using the CVD method or the sputtering method. It has been found that the active material thin-film layer formed by these methods adheres to the current collector, so good charge-discharge cycle properties are exhibited (see Patent Document 4 (Japanese Unexamined Patent Application Publication No. 2002-083594)).

Recently, a method of forming has been developed in which silicon powder or silicon compound is made into a slurry using an organic solvent and an imide binder, applied to the copper foil, dried, and pressed (see Patent Document 5 (Japanese Unexamined Patent Application Publication No. 2007-227328)).

However, in this type of electrode for a lithium-ion secondary battery, for example, during charging, the silicon active material swells in volume by a factor of about 4 due to storage of lithium ions. In addition, it contracts during discharging by releasing lithium ions.

As a result of this swelling and contraction in the volume of the active material layer associated with charging and discharging, a phenomenon in which the active material becomes comminuted to a fine powder and separates from the current collector has been found.

Also, as a result of the adhesion of the active material layer to the current collector, when the volume of the active material layer swells and contracts due to repeated charging and discharging, a large stress acts on the current collector, creases are generated on the current collector, and, in addition, after repeated charging and discharging many times, there is the problem that the foil that constitutes the current collector breaks.

The following is a more detailed description of this problem.

When the active material is reduced to fine powder and separates from the current collector, a reduction in the battery charge-discharge cycle efficiency occurs.

When the current collector is deformed by creasing, or the like, the problem that a short-circuit can easily occur between the positive electrode and the negative electrode occurs.

When the current collector breaks, the problem that it is not possible to maintain the battery performance stable over a long period of time occurs.

In response to such a problem, the inventors of the present invention proposed adopting copper foil with high tensile strength and large breaking elongation (see Patent Document 6 (WO2010/110205)). For example, it was proposed that a lithium-ion secondary battery be configured by adopting electrolytic copper foil with tensile strength of 400 N/mm$^2$ or more, an elongation of from 4.5% to 13%, and a surface roughness Ra of from 0.01 to 1 μm.

Patent Document 6 (WO2010/110205) describes an example that uses a silicon active material in the active material layer.

However, when silicon active material is used, heat may have to be applied to the copper foil that is the current collector, for example, if a silicon active material is used and if a polyimide binder is used, the drying and curing temperature may be from 200° C. to 400° C.

In this case, it has been found that the performance of the electrolytic copper foil as a current collector indicated in Patent Document 6 (WO2010/110205) cannot be sufficiently exhibited.

PRIOR ART DOCUMENTS

Patent Documents

Patent Document 1: Japanese Patent No. 3742144
Patent Document 2: Japanese Patent No. 3850155
Patent Document 3: Japanese Unexamined Patent Application Publication No. H10-255768
Patent Document 4: Japanese Unexamined Patent Application Publication No. 2002-083594
Patent Document 5: Japanese Unexamined Patent Application Publication No. 2007-227328
Patent Document 6: WO2010/110205
Patent Document 7: Japanese Examined Patent No. S53-39376
Patent Document 8: Japanese Patent No. 2740768
Patent Document 9: Japanese Unexamined Patent Application Publication No. H10-96088
Patent Document 10: Japanese Unexamined Patent Application Publication No. 2001-189154

SUMMARY OF THE INVENTION

Problems to be Solved by the Invention

An object of the present invention is to provide a lithium-ion secondary battery that is capable of maintaining stable performance for a long period of time, with excellent charge-discharge cycle efficiency, without occurrence of creasing in a current collector and without breakage of the current collector, even in a lithium-ion secondary battery using a negative electrode in which an active material layer whose main component is, for example, silicon, germanium, or tin is formed on the current collector, and heat is applied to the copper foil current collector, for example, if a polyimide binder is used, a drying and curing temperature of from 200° C. to 400° C. is applied.

Also, another object of the present invention is to provide an electrode for a lithium-ion secondary battery, and an electrolytic copper foil that constitutes a current collector of the electrode.

Means for Resolving the Problems

The electrolytic copper foil for a negative electrode current collector of a lithium-ion secondary battery according to the present invention has a surface roughness Rz on both a first surface (glossy surface, S surface) and a second surface (matt surface, M surface) of from 0.8 to 2.8 μm, and after heat treatment of the electrolytic copper foil at from 200 to 400° C. has a 0.2% proof stress of 250 N/mm$^2$ or more, an elongation of 2.5% or more, and at least one surface of the electrolytic copper foil on which an active material layer has been provided is rust-proofed.

Also, the electrolytic copper foil for a negative electrode current collector of a lithium-ion secondary battery that constitutes the negative electrode current collector of the lithium-ion secondary battery according to the present invention has a surface roughness Rz on both the S surface and the M surface of from 0.8 to 2.8 μm, and after heat treatment of the electrolytic copper foil at from 200 to 400° C. has a 0.2% proof stress of 250 N/mm$^2$ or more, an elongation of 2.5% or more, and at least one surface of the electrolytic copper foil on which an active material layer has been provided is roughened and rust-proofed.

Preferably, the surface of the electrolytic copper foil is a surface that has been roughened by attaching particles whose main component is copper using a plating method, or a surface on which a granular copper plating layer formed by burn plating of copper and a precise copper plating (cover plating) formed on the granular copper plating layer so as not to damage the irregular shape thereof have been formed, or a surface that has been roughened by an etching method.

The negative electrode of the lithium-ion secondary battery according to the present invention uses as a current collector an electrolytic copper foil having a surface roughness Rz on both the S surface and the M surface of from 0.8 to 2.8 μm, and after heat treatment at from 200 to 400° C. has a 0.2% proof stress of 250 N/mm$^2$ or more, an elongation of 2.5% or more, and at least one surface of the electrolytic copper foil has been rust-proofed, and an active material layer is formed on the surface of the current collector that has been rust-proofed.

Also, the negative electrode of a lithium-ion secondary battery according to the present invention uses as a current collector an electrolytic copper foil having a surface roughness Rz on both the S surface and the M surface of from 0.8 to 2.8 μm, and after heat treatment at from 200 to 400° C. has a 0.2% proof stress of 250 N/mm$^2$ or more, an elongation of 2.5% or more, and at least one surface of the electrolytic copper foil has been roughened and rust-proofed, and an active material layer is formed on the surface of the current collector that has been rust-proofed.

Preferably, the active material layer is deposited on the current collector by applying a slurry that is a mixture of active material, binder, and solvent, then dried, and pressed.

Preferably, the active material layer is formed from active material whose main component is carbon, silicon, germanium, or tin.

The lithium-ion secondary battery according to the present invention uses as a current collector an electrolytic copper foil having a surface roughness Rz on both the S surface and the M surface of from 0.8 to 2.8 μm, and after heat treatment at from 200 to 400° C. has a 0.2% proof stress of 250 N/mm$^2$ or more, an elongation of 2.5% or more, and at least one surface of the electrolytic copper foil has been rust-proofed, and uses an electrode in which an active material layer has been formed on the surface of the electrolytic copper foil that has been rust-proofed as a negative electrode.

The lithium-ion secondary battery according to the present invention uses as a current collector an electrolytic copper foil having a surface roughness Rz on both the S surface and the M surface of from 0.8 to 2.8 μm, and after heat treatment at from 200 to 400° C. has a 0.2% proof stress of 250 N/mm$^2$ or more, an elongation of 2.5% or more, and at least one surface of the electrolytic copper foil has been roughened and rust-proofed, and uses an electrode in which an active material layer has been formed on the surface of the electrolytic copper foil that has been rust-proofed as a negative electrode.

The present invention provides a copper foil for which the results of depth profile (depth direction) analysis by secondary ion mass spectrometry in the thickness direction of the copper foil are: chlorine (Cl), carbon (C), and oxygen (O) each contained in a concentration of from $10^{17}$ to $5 \times 10^{20}$ atoms/cm$^3$, and sulfur (S) and nitrogen (N) each contained in a concentration of from $10^{15}$ to $10^{19}$ atoms/cm$^3$.

Preferably, the crystal grain diameter of the copper foil described above in a cross-section in the copper foil thickness direction obtained with a scanning ion microscope is 400 nm or less.

Also, the present invention provides a copper foil having an average overall copper purity of from 95 to 99.999% by mass, having a precipitated phase or domains from 1 to 500 nm in size in which the detected content of Cu component is low compared with the Cu concentration of the surrounding matrix when observed on a transmission electron microscope (TEM) image or on a scanning transmission electron microscope (STEM) image.

Preferably, the size of the domains in which the detected content of Cu component is low compared with the surroundings is from 1 to 150 nm.

Preferably, the domains whose Cu concentration is low compared with the surroundings include mainly carbon (C).

Also, preferably, the domains whose Cu concentration is low compared with the surroundings and whose main component is carbon (C) further includes sulfur (S), chlorine (Cl) or nitrogen (N).

Effect of the Invention

According to the present invention, by using the electrolytic copper foil as described above in the negative electrode current collector of a lithium-ion secondary battery, deformation such as creasing or the like of the current collector due to charging and discharging does not occur, so it is possible to prevent short-circuits between the positive electrode and the negative electrode, and the current collector does not break, so it is possible to provide a lithium-ion secondary battery with stable performance over a long period of time.

Figure 1:
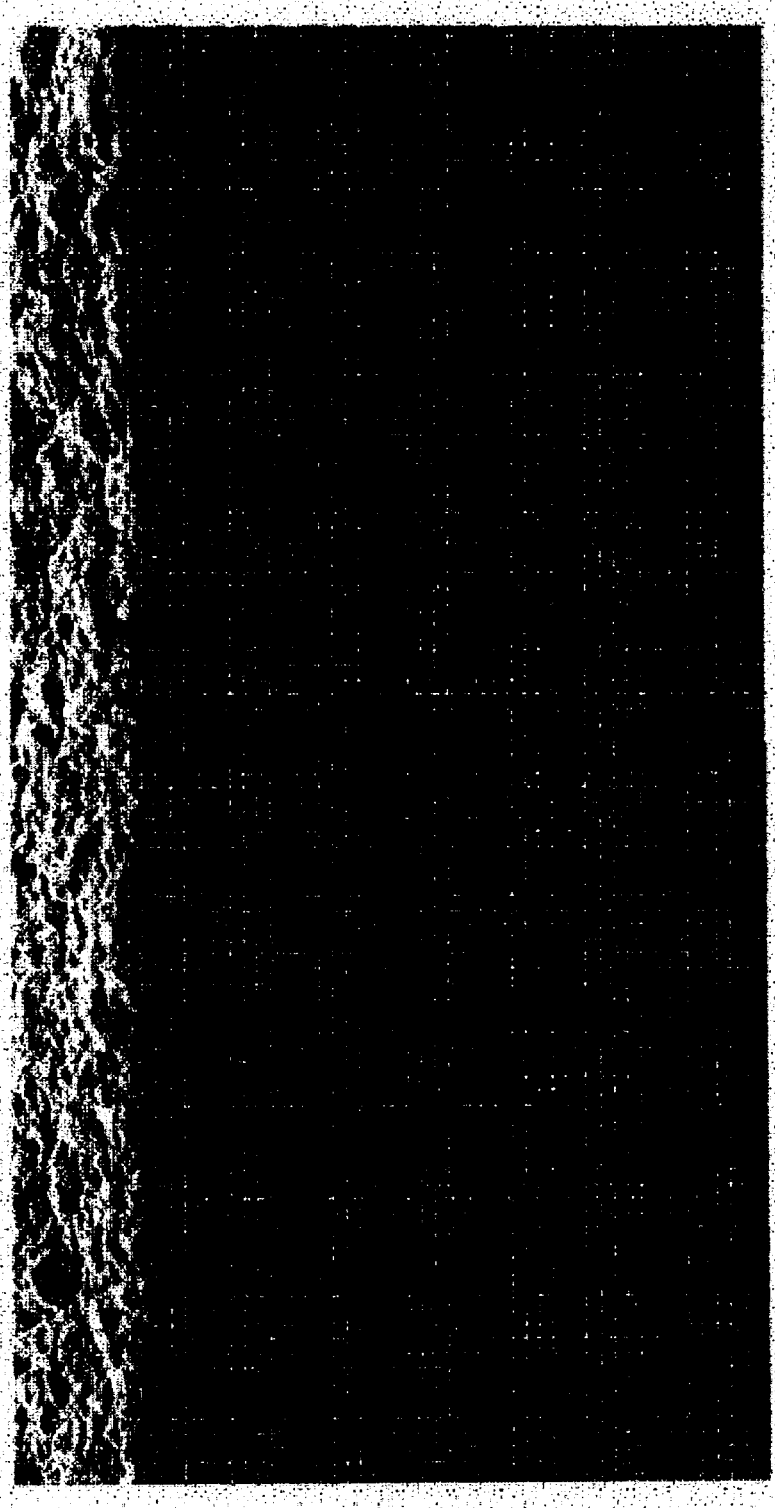
FIG. 1 shows a cross-sectional image by focused ion beam (FIB)-SIM observation (inclination angle 45°).

The following is a description of embodiments of a lithium ion secondary battery, an electrode for the secondary battery, and an electrolytic copper foil for an electrode for the secondary battery according to the present invention.

FIRST EMBODIMENT

First Aspect

An electrolytic copper foil for a negative electrode current collector of a lithium-ion secondary battery according to a first aspect of a first embodiment of the present invention has a surface roughness Rz on both a first surface (glossy surface, S surface) and a second surface (matt surface, M surface) of from 0.8 to 2.8 μm, and after heat treatment at from 200 to 400° C. for 30 minutes to one hour and 30 minutes has a 0.2% proof stress of 250 N/mm$^2$ or more, an elongation of 2.5% or more, and at least one surface of the electrolytic copper foil has been rust-proofed, or roughened and rust-proofed.

In this specification, the first surface on the side of the electrolytic copper foil that contacted the surface of a cathode drum during manufacture is referred to as the glossy surface "S surface", and the opposite second surface is referred to as the matt surface "M surface".

Second Aspect

A negative electrode current collector of a lithium-ion secondary battery according to a second aspect of the first embodiment of the present invention uses as current collector an electrolytic copper foil having a surface roughness Rz on both the first surface and the second surface of from 0.8 to 2.8 μm, and after heat treatment at from 200 to 400° C. for 30 minutes to one hour and 30 minutes has a 0.2% proof stress of 250 N/mm$^2$ or more, an elongation of 2.5% or more, and at least one surface of the electrolytic copper foil has been rust-proofed, or roughened and rust-proofed.

Third Aspect

A negative electrode of a lithium-ion secondary battery according to a third aspect of the first embodiment of the present invention uses as the current collector an electrolytic copper foil having a surface roughness Rz on both the first surface and the second surface of from 0.8 to 2.8 μm, and after heat treatment at from 200 to 400° C. for 30 minutes to one hour and 30 minutes has a 0.2% proof stress of 250 N/mm$^2$ or more, an elongation of 2.5% or more, and at least one surface of the electrolytic copper foil has been rust-proofed, or roughened and rust-proofed, and an active material layer that constitutes the negative electrode is applied to the surface of the current collector that has been rust-proofed.

By using this electrolytic copper foil as the current collector, and applying the active material layer to the surface of the current collector for use as the negative electrode of the lithium-ion secondary battery, then even if the current collector is subjected to stress due to swelling and contraction of the active material layer associated with storage and discharge of lithium, the reduction in charge-discharge cycle efficiency of the battery is low, and deformation such as creases or the like and breakage are not produced on the current collector.

Discussion of Conventional Technology

When a conventional carbon active material layer constituting the negative electrode is formed, paste made from carbon which is the negative electrode active material, polyvinylidene fluoride resin which is a binder, and N-methylpyrrolidone as solvent is prepared, applied to both surfaces of the copper foil, and dried. In this case, drying is carried out at about 150° C.

At a temperature of about 150° C., the tensile strength, the 0.2% proof stress, and the elongation of the electrolytic copper foil are virtually unchanged. For example, in the case of the electrolytic copper foil disclosed in Patent Document 1 (Japanese Patent No. 3742144) produced using an electrolytic solution by adding a compound having a mercapto group, chloride ion, low molecular weight glue having a molecular weight of 10000 or less, and polymer polysaccharide to copper sulfate-sulfuric acid electrolyte, the tensile strength of 10 μm thick copper foil at room temperature is from 300 to 350 N/mm$^2$, but, when dried at about 150° C., the performance is virtually unchanged.

In addition, in the case of a carbon active material, the volumetric swelling during charging and discharging is at most 10%, so the charge-discharge cycle efficiency is not significantly reduced, and deformation and breakage of the current collector due to charging and discharging does not occur.

Also, in the case of the electrolytic copper foil with thickness of 10 μm produced from copper sulfate-sulfuric acid electrolyte as disclosed in Patent Document 2 (Japanese Patent No. 3850155), the tensile strength at room temperature is about 570 N/mm$^2$, and the elongation is about 7%, but when dried at a temperature of about 150° C., the performance changes, the tensile strength is about 230 N/mm$^2$, and the elongation is about 25%.

However, in the case of a carbon active material, the volumetric swelling during charging and discharging is at most 10%, so even for a foil with a low tensile strength and a large elongation as described above, the charge-discharge cycle efficiency is not significantly reduced, and deformation and breakage of the current collector due to charging and discharging does not occur.

In contrast, when silicon (silicon-based material) is used as the active material, as described in this embodiment, a polyimide resin may be used as the binder to prevent swelling and contraction of the active material during charging and discharging. In this case, the drying and curing temperature is higher than when a carbon-based active material is used, and drying and curing is carried out at temperatures in the range from 200° C. to 400° C. for 30 minutes to one hour and 30 minutes.

By heating at such high temperatures, the foil of an electrolytic copper foil as disclosed, for example, in Patent Document 1 (Japanese Patent No. 3742144) and Patent Document 2 (Japanese Patent No. 3850155) is annealed and softened, the charge-discharge cycle efficiency is significantly reduced, and the copper foil easily deforms and breaks due to the swelling and contraction of the active material during charging and discharging.

When the copper foil is deformed, a stress in excess of the yield point can be considered to have been applied to the copper foil. The yield point is the stress at which there is a change from elasticity to plasticity. When a stress in the elastic zone is applied to a copper foil, the copper foil does not deform. However, the copper foil deforms when a stress is applied in the plastic zone.

Therefore, in the case of a copper foil whose yield point is high, after the copper foil has been heated during drying and curing, the potential for deformation of the copper foil is very low even when the active material swells and contracts due to charging and discharging, and stress is applied to the copper foil which is the current collector.

Therefore, even when an electrolytic copper foil having a tensile strength at room temperature of 400 N/mm$^2$ or more, and elongation in the range from 4.5% to 13% as disclosed in Patent Document 6 (WO2010/110205) is used, it does not necessarily mean that there would be no deformation of the copper foil due to swelling and contraction due to charging and discharging.

Only a copper foil with high yield point after heating due to drying and curing can be said to be a copper foil in which deformation does not occur.

Here, the yield point is measured using a tensile test, but in the case of electrolytic copper foil, this point is not clear. In this case, the value at which a 0.2% strain is produced is normally used instead of the yield point. This is referred to as the 0.2% proof stress.

In the case of electrolytic copper foil, having a large 0.2% proof stress at room temperature does not necessarily mean having a large yield point after heat treatment. For example, the copper foil indicated by Comparative Example 2 in Table 2 is a copper foil that was produced based on Patent Document 2 (U.S. Pat. No. 3,850,155). The copper foil has a high tensile strength (510 N/mm$^2$) at room temperature and 0.2% proof stress (345 N/mm$^2$), but, after heat treatment, the annealed and softened copper foil has a low tensile strength (204 N/mm$^2$) and 0.2% proof stress (102 N/mm$^2$).

As disclosed in Patent Document 6 (WO2010/110205), a material having a tensile strength at room temperature of 400 N/mm$^2$ or more is annealed when heated, so the 0.2% proof stress becomes low, so there is a problem to use the material in a lithium-ion secondary battery. Therefore, it is important that the 0.2% proof stress after heat treatment is not less than a certain value.

Also, if the elongation is low, the reduction in charge-discharge cycle efficiency tends to be large during many repetitions of the charge-discharge cycle.

In order to minimize the reduction in the charge-discharge cycle efficiency, it is necessary to have a 0.2% proof stress of 250 N/mm$^2$ or more, and an elongation of 2.5% or more.

The electrolytic copper foil for the negative electrode current collector of the lithium-ion secondary battery according to the embodiment of the present invention is, (a) processed by forming the active material layer that constitutes the negative electrode, (b) heat treated from 200° C. to 400° C. for 30 minutes to one hour and 30 minutes, (c) the resulting unprocessed copper foil having a 0.2% proof stress of 250 N/mm$^2$ or more and elongation of 2.5% or more is rust-proofed or roughened and rust-proofed on at least one side thereof, and the resulting material is used as the current collector.

As a result, even when subjected to stress as a result of swelling and contraction of the active material layer associated with storage and discharge of lithium, deformation such as creases or the like and breakage or the like does not occur in the current collector.

When the charge-discharge cycle of a lithium ion secondary battery is repeated, the capacity retention ratio is reduced. The lower reduction in the capacity retention ratio (charge-discharge cycle efficiency), the higher the performance of the lithium ion secondary battery.

The factors which affect this property include the 0.2% proof stress and the elongation, as discussed already, but other factors include degradation of the negative electrode active material itself, formation of a film on the active material surface due to decomposition of the electrolyte, the occurrence of cracking of the active material, peeling between the active material and the copper foil, and the like.

Of these, peeling between the active material and the copper foil is considered to be caused by the copper foil.

Surface roughness is also a cause of peeling between the active material and the copper foil, in addition to 0.2% proof stress and elongation.

The proper range for the surface roughness is Rz from 0.8 to 2.8 μm. When the surface roughness Rz is less than 0.8 μm, there is no effect, and when Rz is greater than or equal to 2.8 μm, the effect is saturated, and, on the contrary, the capacity retention ratio during charging and discharging becomes poorer. Therefore, it is effective to form the active material layer on an electrolytic copper foil (current collector) having a surface roughness Rz from 0.8 to 2.8 μm.

In the embodiment of the present invention, the tensile strength, 0.2% proof stress, and the elongation are the values measured in accordance with the methods defined in the Japanese Industrial Standard (JIS K 6251).

Also, the surface roughness Rz is the average roughness of 10 points as defined by the Japanese Industrial Standard (JIS B 0601-1994), with the values measured by, for example, a stylus type surface roughness meter.

The electrolytic copper foil for the negative electrode current collector of the lithium-ion secondary battery according to the embodiment of the present invention is, (a) processed by forming the active material layer that constitutes the negative electrode on the electrolytic copper foil, (b) given the surface roughness Rz from 0.8 to 2.8 µm on both the glossy surface (S surface) and the matt surface (M surface), (c) after heat treatment at from 200° C. to 400° C., the resulting electrolytic copper foil having a 0.2% proof stress of 250 N/mm$^2$ or more and elongation of 2.5% or more is rust-proofed on at least one side thereof, and used as the current collector.

As a result, even if subjected to stresses due to swelling and contraction of the active material thin-film associated with storage and discharge of lithium, the charge-discharge cycle efficiency of the secondary battery is not reduced, and deformation such as creases and the like and breakage and the like does not occur in the current collector.

Also, the electrolytic copper foil for the negative electrode current collector of the lithium ion secondary battery according to the embodiment of the present invention is, (a) processed by forming the active material layer, that constitutes the negative electrode, on the electrolytic copper foil as described above, (b) given the surface roughness Rz from 0.8 to 2.8 µm on both the S surface and the M surface, (c) heat treated from 200° C. to 400° C. for 30 minutes to one hour and 30 minutes, (d) thereafter, electrolytic copper foil having a 0.2% proof stress of 250 N/mm$^2$ or more and an elongation of 2.5% or more is used, and (e) at least one surface thereof is roughened and rust-proofed, and used as the current collector.

As a result, the charge-discharge cycle efficiency of the secondary battery is not reduced, so even if subjected to stress due to swelling and contraction of the active material thin-film associated with storage and discharge of lithium, deformation such as creasing or the like and breakage and the like does not occur in the current collector.

Important factors for the electrolytic copper foil for the current collector of this embodiment with respect to the reduction in the charge-discharge cycle efficiency of the battery, and deformation such as creases and the like and breakage and the like caused by stresses due to the swelling and contraction of the active material layer associated with storage and discharge of lithium are the surface roughness Rz from 0.8 to 2.8 µm on both the S surface and the M surface, the 0.2% proof stress of 250 N/mm$^2$ or more and the elongation of 2.5% or more after the heat treatment at from 200 to 400° C. for 30 minutes to one hour and 30 minutes.

Even if the surface roughness Rz on both the S surface and the M surface is from 0.8 to 2.8 µm, the heat treatment is at from 200 to 400° C. for 30 minutes to one hour and 30 minutes, and, thereafter, even if the 0.2% proof stress is 250 N/mm$^2$ or more, after the heat treatment at from 200 to 400° C. for 30 minutes to one hour and 30 minutes if the elongation is less than 2.5%, deformation such as creasing or the like and breakage and the like of the current collector will not occur, but a large reduction in the charge-discharge cycle efficiency of the secondary battery tends to be seen.

The electrolytic copper foil for the negative electrode current collector of the lithium-ion secondary battery according to the embodiment of the present invention is manufactured by the following method comprising (a) providing sulfuric acid-copper sulfate aqueous solution as electrolyte between an insoluble anode made from titanium covered with a platinum group element or an oxide thereof and a titanium cathode drum that is provided in opposition to the anode, (b) depositing copper on the surface of the cathode drum by passing a direct current between both of the electrodes while rotating the cathode drum at a constant velocity, and (c) peeling the deposited copper from the surface of the cathode drum, and continuously winding it.

The electrolytic copper foil for the negative electrode current collector of the lithium ion secondary battery according to the embodiment of the present invention can be manufactured by adding any of the following A, B-1 to B-3 organic additives and chloride ion to the sulfuric acid-copper sulfate electrolyte.

Additive A: One or more additives selected from thiourea and thiourea derivatives Additive B:

B-1; Thiourea or a thiourea derivative

B-2: Polymeric polysaccharides such as animal glue, gelatine, polyethylene glycol, polypropylene glycol, starch, cellulose based water soluble polymers (carboxymethyl cellulose, hydroxyethyl cellulose, and the like); polyethylene imide, and polyacrylamide B-3: A combination of one or more additives selected from each of B-1 and B-2.

Here, thiourea and thiourea derivatives include thiourea ($CH_4N_2S$), N, N'-dimethyl thiourea ($C_3H_8N_2S$), N,N'-diethyl thiourea ($C_5H_{12}N_2S$), tetramethyl thiourea ($C_5H_{12}N_2S$), thiosemicarbazide ($CH_5N_3S$), N-aryl thiourea ($C_4H_8N_2S$), ethylene thiourea ($C_3H_6N_2S$), and other water soluble thioureas and thiourea derivatives.

The electrolytic copper foil (unprocessed copper foil) manufactured by the process described above can be used as it is as the current collector, but, in most cases, it is used as the electrolytic copper foil for the negative electrode current collector of the lithium-ion secondary battery after applying (a) inorganic rust-proofing such as a chromate process, Ni or Ni alloy plating, Co or Co alloy plating, Zn or Zn alloy plating, Sn or Sn alloy plating, or a chromate process applied above any of the above types of plating, and the like, (b) organic rust-proofing such as benzotriazole and the like, or (c) a silane coupling agent treatment or the like.

The above inorganic rust-proofing treatment, organic rust-proofing treatment, and silane coupling agent treatment perform the role of increasing the adhesion strength to the active material, and preventing reduction in the charge-discharge cycle efficiency of the battery.

Also, a surface roughening treatment may be carried out on the surface of the electrolytic copper foil.

The surface roughening treatment can be selected as appropriate, such as a plating method, an etching method, and the like.

The plating method is a method of roughening the surface by forming a thin film layer having irregularities on the surface of the unprocessed electrolytic copper foil. The plating method can be an electrolytic plating method or a non-electrolytic plating method.

Preferably, a method of forming a plated film whose main component is copper, such as copper or a copper alloy, on the surface of the unprocessed electrolytic copper foil is used as the method of surface roughening by a plating method.

Preferably, a surface roughening method by plating that is commonly used on printed circuit board copper foil such as the method disclosed in, for example, Patent Document 7 (Japanese Examined Patent No. S53-39376) is used as the method of surface roughening by electroplating. In other words, in such a surface roughening method, after a granular copper plating layer is formed by so-called "burn plating", a "cover plating" is applied on top of the granular copper plating layer so as to not damage the irregular shape, so that a substantially smooth plating layer is deposited on the granular copper layer to form so-called "lumpy copper".

Surface roughing by etching methods can include methods such as physical etching or chemical etching.

Physical etching includes methods of etching such as sandblasting or the like.

There have been many proposals for a liquid that includes organic or inorganic acids, oxidizing agent, and additives as the processing liquid for chemical etching.

For example, Patent Document 8 (Japanese Patent No. 2740768) discloses an organic acid+hydrogen peroxide+a corrosion prevention agent such as triazole or the like+a surfactant.

Also, Patent Document 9 (Japanese Unexamined Patent Application Publication No. H10-96088) discloses a liquid containing an inorganic acid+a peroxide+an azole+a halide.

Normally a bath containing acid, oxidizing agent, and additives such as chelating agent or the like is used, and the crystal grain boundaries of the copper is preferentially dissolved. For example, besides the liquid compositions disclosed in Patent Documents 8 and 9, commercial products such as CZ-8100 or CZ-8101 produced by Mec Co., Ltd., CPE-900 produced by Mitsubishi Gas Chemical Co., Ltd., and the like can be used.

The active material layer in the embodiment of the present invention is a substance that stores and discharges lithium, and is preferably an active material that stores lithium by alloying.

Such an active material can include carbon, silicon, germanium, tin, lead, zinc, magnesium, sodium, aluminum, potassium, indium, and the like.

Of these, carbon, silicon, germanium, and tin are preferably used due to their high theoretical capacity.

Therefore, preferably, the active material layer used in the embodiment of the present invention is a layer whose main component is carbon, silicon, germanium, or tin. In particular, silicon is an active material that can be preferably adopted for the lithium-ion secondary battery with the electrolytic copper foil according to the embodiment of the present invention as the current collector.

Preferably, the method of forming the active material layer in the embodiment of the present invention is to form a slurry of the active material, binder, and solvent, apply the slurry, dry it, and press it.

In the embodiment of the present invention, preferably, the current collector is thin, and the active material layer can be formed on either one side or both sides of the current collector.

Lithium may be stored in or added to the active material layer in advance, in the embodiment of the present invention.

Lithium may be added when forming the active material layer. In other words, lithium is contained in the active material layer by forming the active material layer containing lithium.

Also, after forming the active material layer, lithium may be stored in or added to the active material layer. An electrochemical method of storing or adding lithium can be used as the method of storing or adding lithium to the active material layer.

A non-aqueous electrolyte used in the lithium-ion secondary battery in the embodiment of the present invention is an electrolyte in which a solute is dissolved in a solvent.

There is no particular limitation on the solvent of the non-aqueous electrolyte provided it is a solvent used in lithium-ion secondary batteries, but, for example, cyclic carbonates such as ethylene carbonate, propylene carbonate, butylene carbonate, vinylene carbonate, or chain carbonates such as dimethyl carbonate, diethyl carbonate, methyl ethyl carbonate, and the like can be used. Preferably, a solvent that is a mixture of cyclic carbonate and chain carbonate is used. Also, a mixed solvent that includes the above cyclic carbonate and an etheric solvent such as 1,2-dimethoxyethane, 1,2-diethoxyethane, or a chain ester such as γ-butyrolactone, sulfolane, methyl acetate, and the like, may be used.

There is no particular limitation on the solute of the non-aqueous electrolyte provided it is a solute used in lithium-ion secondary batteries, for example, $LiPF_6$, $LiBF_4$, $LiCF_3SO_3$, $LiN(CF_3SO_2)_2$, $LiN(C_2F_5SO_2)_2$, $LiN(CF_3SO_2)(C_4F_9SO_2)$, $LiC(CF_3SO_2)_3$, $LiC(C_2F_5SO_2)_3$, $LiAsF_6$, $LiClO_4$, $Li_2B_{10}Cl_{10}$, $Li_2B_{12}Cl_{12}$, and the like. In particular, a solute mixture of $LiXFy$ (in the formula, X is P, As, Sb, B, Bi, Al, Ga, or In, and when X is P, As, or Sb, y is 6, and when X is B, Bi, Al, Ga, or In, y is 4) and lithium perfluoroalkylsulfonyl imide $LiN(C_mF_{2m+1}SO_2)(C_nF_{2n+1}SO_2)$ (in the formula, m and n are each independently an integer from 1 to 4) or lithium perfluoroalkyl sulfonate methide $LiC(C_pF_{2p+1}SO_2)(C_qF_{2q+1}SO_2)(C_rF_{r+1}SO_2)$ (in the formula, p, q, and r are each independently an integer from 1 to 4) can be preferably used. Of these, in particular, a solute mixture of $LiPF_6$ and $LiN(C_2F_5SO_2)_2$ can be preferably used.

Also, gel polymer electrolytes impregnated with an electrolytic solution in polyethylene oxide, polyacrylonitrile, polyfluorovinylidene, and other polymer electrolytes, or inorganic solid electrolytes such as LiI, $Li_3N$, and the like can be used as the non-aqueous electrolyte.

There is no restriction on the use of the electrolyte used in the lithium-ion secondary battery according to the embodiment of the present invention as long as the Li compound used as solute that exhibits ion conduction and the solvent that dissolves and retains the solute are not decomposed by the voltage during charging, discharging, or storage of the battery.

Also, examples of positive electrode active material used in the positive electrode of the secondary battery include transition metal oxides containing lithium such as $LiCO_2$, $LiNiO_2$, $LiMn_2O_4$, $LiMnO_2$, $LiCo_{0.5}Ni_{0.5}O_2$, $LiNi_{0.7}CO_{0.2}Mn_{0.1}O_2$, or metal oxides not containing lithium such as $MnO_2$, and the like. Also, there is no restriction on other substances provided they can absorb or desorb lithium electrochemically.

According to the embodiment of the present invention, it is possible to suppress the reduction in charge-discharge cycle efficiency, and suppress the occurrence of deformation such as creases or the like and breakage of the current collector due to charging and discharging.

Also, according to the embodiment of the present invention, it is possible to provide a lithium-ion secondary battery that prevents short-circuits between the positive electrode and the negative electrode, and that maintains stable performance over a long period of time.

First Example Set

The following is a more detailed description of the present invention based on a First Example set. The present invention is not limited in any way to the following example set, and it is possible to modify it as appropriate to the extent that the intention is not changed.

Working Examples 1 to 29 and Comparative Examples 1 to 8

Manufacture of Unprocessed Copper Foil

An electrolyte solution for manufacturing the foil was prepared by adding each of the additives with the composition shown in Table 1 to an acidic copper electrolytic bath of copper from 70 to 130 g/l and sulfuric acid from 80 to 140 g/l.

The chloride ion concentrations of the first example set were all adjusted to 30 ppm, but the chloride ion concentration was changed as appropriate in accordance with the electrolysis conditions, so there was no limit to this concentration.

Using the prepared electrolytic solution, and using titanium electrode covered with a noble metal oxide as the anode, and a titanium rotating drum as the cathode, a thickness of 18 μm of unprocessed copper foil was produced under the electrolysis conditions shown in Table 1 (current density, liquid temperature), for the copper foil of Working Example 1-2 and Working Example 8-2.

Likewise, unprocessed copper foil with a thickness of 20 μm was produced for Working Example 1-1, Working Examples 2 to 8-1, and Working Examples 9 to 29.

Also, a thickness of 20 μm of unprocessed copper foil was produced using the electrolytic solution with the composition shown in Table 1 for Comparative Examples 1 and 2, and Comparative Examples 5 to 8. A thickness of 18 μm of unprocessed copper foil was produced using the electrolytic solution with the composition shown in Table 1 for Comparative Example 3.

Comparative Example 2 was electrolytic copper foil produced in accordance with the disclosure of Patent Document 2 (Japanese Patent No. 3850155).

For Comparative Example 4, a rolled copper alloy foil with a thickness of 20 μm containing 0.02% Zr and the remainder copper was used.

TABLE 1

| | Production conditions for copper foil for negative electrode current collector | | | |
|---|---|---|---|---|
| | A | | B | |
| | Additive type | (ppm) | Additive type | (ppm) |
| Working Example 1-1 | Thiourea | 1-10 | — | — |
| Working Example 1-2 | Thiourea | 1-10 | — | — |
| Working Example 2 | N,N'-dimethylthiourea | 1-10 | — | — |
| Working Example 3 | N,N'-diethylthiourea | 1-10 | — | — |
| Working Example 4 | Tetramethylthiourea | 1-10 | — | — |
| Working Example 5 | Thiosemicarbazide | 1-10 | — | — |
| Working Example 6 | N-allylthiourea | 1-10 | — | — |
| Working Example 7 | Ethylenethiourea | 1-10 | — | — |
| Working Example 8-1 | Thiourea | 1-10 | Polyacrylamide | 1-20 |
| Working Example 8-2 | Thiourea | 1-10 | Polyacrylamide | 1-20 |
| Working Example 9 | Thiourea | 1-10 | Polyacrylamide | 1-20 |
| Working Example 10 | Thiourea | 1-10 | Polyacrylamide | 1-20 |
| Working Example 11 | Thiourea | 1-10 | Polyacrylamide | 1-20 |
| Working Example 12 | N,N'-dimethylthiourea | 1-10 | Gelatine | 1-20 |
| Working Example 13 | N,N'-dimethylthiourea | 1-10 | Polyethyleneglycol | 1-20 |
| Working Example 14 | N,N'-dimethylthiourea | 1-10 | Starch | 1-20 |
| Working Example 15 | N,N'-dimethylthiourea | 1-10 | Hydroxyethyl cellulose | 1-20 |
| Working Example 16 | N,N'-dimethylthiourea | 1-10 | Polyethyleneimine | 1-20 |
| Working Example 17 | N,N'-dimethylthiourea | 1-10 | Polyacrylamide | 1-20 |
| Working Example 18 | Tetramethylthiourea | 1-10 | Gelatine | 1-20 |
| Working Example 19 | Tetramethylthiourea | 1-10 | Polyethyleneglycol | 1-20 |
| Working Example 20 | Tetramethylthiourea | 1-10 | Starch | 1-20 |
| Working Example 21 | Tetramethylthiourea | 1-10 | Hydroxyethyl cellulose | 1-20 |

TABLE 1-continued

Production conditions for copper foil for negative electrode current collector

| | | | | |
|---|---|---|---|---|
| Working Example 22 | Tetramethylthiourea | 1-10 | Polyethyleneimine | 1-20 |
| Working Example 23 | Tetramethylthiourea | 1-10 | Polyacrylamide | 1-20 |
| Working Example 24 | Ethylenethiourea | 1-10 | Gelatine | 1-20 |
| Working Example 25 | Ethylenethiourea | 1-10 | Polyethyleneglycol | 1-20 |
| Working Example 26 | Ethylenethiourea | 1-10 | Starch | 1-20 |
| Working Example 27 | Ethylenethiourea | 1-10 | Hydroxyethyl cellulose | 1-20 |
| Working Example 28 | Ethylenethiourea | 1-10 | Polyethyleneimine | 1-20 |
| Working Example 29 | Ethylenethiourea | 1-10 | Polyacrylamide | 1-20 |
| Comparative Example 1 | — | — | — | — |
| Comparative Example 2 | — | — | — | — |
| Comparative Example 3 | Thiourea | 1-10 | Polyacrylamide | 1-20 |
| Comparative Example 4 | Rolled copper alloy foil | | | |
| Comparative Example 5 | — | — | — | — |
| Comparative Example 6 | — | — | — | — |
| Comparative Example 7 | — | — | — | — |
| Comparative Example 8 | — | — | — | — |

| | MPS (ppm) | Gelatine (ppm) | HEC (ppm) | Chlorine (ppm) |
|---|---|---|---|---|
| Working Example 1-1 | — | — | — | 30.0 |
| Working Example 1-2 | — | — | — | 30.0 |
| Working Example 2 | — | — | — | 30.0 |
| Working Example 3 | — | — | — | 30.0 |
| Working Example 4 | — | — | — | 30.0 |
| Working Example 5 | — | — | — | 30.0 |
| Working Example 6 | — | — | — | 30.0 |
| Working Example 7 | — | — | — | 30.0 |
| Working Example 8-1 | — | — | — | 30.0 |
| Working Example 8-2 | — | — | — | 30.0 |
| Working Example 9 | — | — | — | 30.0 |
| Working Example 10 | — | — | — | 30.0 |
| Working Example 11 | — | — | — | 30.0 |
| Working Example 12 | — | — | — | 30.0 |
| Working Example 13 | — | — | — | 30.0 |
| Working Example 14 | — | — | — | 30.0 |
| Working Example 15 | — | — | — | 30.0 |
| Working Example 16 | — | — | — | 30.0 |
| Working Example 17 | — | — | — | 30.0 |
| Working Example 18 | — | — | — | 30.0 |
| Working Example 19 | — | — | — | 30.0 |

TABLE 1-continued

Production conditions for copper foil for negative electrode current collector

|  |  |  |  |  |
|---|---|---|---|---|
| Working Example 20 | — | — | — | 30.0 |
| Working Example 21 | — | — | — | 30.0 |
| Working Example 22 | — | — | — | 30.0 |
| Working Example 23 | — | — | — | 30.0 |
| Working Example 24 | — | — | — | 30.0 |
| Working Example 25 | — | — | — | 30.0 |
| Working Example 26 | — | — | — | 30.0 |
| Working Example 27 | — | — | — | 30.0 |
| Working Example 28 | — | — | — | 30.0 |
| Working Example 29 | — | — | — | 30.0 |
| Comparative Example 1 | 1-10 | 1-20 | 1-20 | 30.0 |
| Comparative Example 2 | — | — | — | — |
| Comparative Example 3 | — | — | — | 30.0 |
| Comparative Example 4 |  |  |  |  |
| Comparative Example 5 | — | 2 | — | 0.3 |
| Comparative Example 6 | — | 2 | — | 0.3 |
| Comparative Example 7 | — | 4 | — | 0.3 |
| Comparative Example 8 | — | 10 | — | 0.5 |

|  | Current density (A/dm$^2$) | Liquid temperature (° C.) | Roughening process | Heating temperature (° C.) |
|---|---|---|---|---|
| Working Example 1-1 | 30-70 | 40-60 | Not performed | 230° C. |
| Working Example 1-2 | 30-70 | 40-60 | Performed | 230° C. |
| Working Example 2 | 30-70 | 40-60 | Not performed | 230° C. |
| Working Example 3 | 30-70 | 40-60 | Not performed | 230° C. |
| Working Example 4 | 30-70 | 40-60 | Not performed | 230° C. |
| Working Example 5 | 30-70 | 40-60 | Not performed | 230° C. |
| Working Example 6 | 30-70 | 40-60 | Not performed | 230° C. |
| Working Example 7 | 30-70 | 40-60 | Not performed | 230° C. |
| Working Example 8-1 | 30-70 | 40-60 | Not performed | 230° C. |
| Working Example 8-2 | 30-70 | 40-60 | Performed | 230° C. |
| Working Example 9 | 30-70 | 40-60 | Not performed | 300° C. |
| Working Example 10 | 30-70 | 40-60 | Not performed | 350° C. |
| Working Example 11 | 30-70 | 40-60 | Not performed | 400° C. |
| Working Example 12 | 30-70 | 40-60 | Not performed | 300° C. |
| Working Example 13 | 30-70 | 40-60 | Not performed | 300° C. |
| Working Example 14 | 30-70 | 40-60 | Not performed | 300° C. |
| Working Example 15 | 30-70 | 40-60 | Not performed | 300° C. |
| Working Example 16 | 30-70 | 40-60 | Not performed | 300° C. |

TABLE 1-continued

Production conditions for copper foil for negative electrode current collector

| | | | | |
|---|---|---|---|---|
| Working Example 17 | 30-70 | 40-60 | Not performed | 300° C. |
| Working Example 18 | 30-70 | 40-60 | Not performed | 300° C. |
| Working Example 19 | 30-70 | 40-60 | Not performed | 300° C. |
| Working Example 20 | 30-70 | 40-60 | Not performed | 300° C. |
| Working Example 21 | 30-70 | 40-60 | Not performed | 300° C. |
| Working Example 22 | 30-70 | 40-60 | Not performed | 300° C. |
| Working Example 23 | 30-70 | 40-60 | Not performed | 300° C. |
| Working Example 24 | 30-70 | 40-60 | Not performed | 300° C. |
| Working Example 25 | 30-70 | 40-60 | Not performed | 300° C. |
| Working Example 26 | 30-70 | 40-60 | Not performed | 300° C. |
| Working Example 27 | 30-70 | 40-60 | Not performed | 300° C. |
| Working Example 28 | 30-70 | 40-60 | Not performed | 300° C. |
| Working Example 29 | 30-70 | 40-60 | Not performed | 300° C. |
| Comparative Example 1 | 30 | 40-60 | Not performed | 300° C. |
| Comparative Example 2 | 30 | 40-60 | Not performed | 300° C. |
| Comparative Example 3 | 30-70 | 40-60 | Performed | 300° C. |
| Comparative Example 4 | | | Not performed | 300° C. |
| Comparative Example 5 | 55 | 50 | Not performed | 180° C. |
| Comparative Example 6 | 55 | 50 | Not performed | 230° C. |
| Comparative Example 7 | 55 | 50 | Not performed | 300° C. |
| Comparative Example 8 | 55 | 50 | Not performed | 300° C. |

MPS: 3-mercapto-1-propanesulfonic acid sodium
HEC: Hydroxyethyl cellulose

Production of the Negative Electrode Current Collector

For Working Examples 1-2 and 8-2 and Comparative Example 3, a granular copper plating layer was formed on the surface of the electrolytic copper foil by burn plating by electroplating. In addition, a precise copper plating (cover plating) was carried out on the granular copper plating layer so as not to damage the irregular shape, to produce a roughened surface electrolytic copper foil with improved adhesion between the granular copper and the electrolytic copper foil.

As described above, for Working Example 1-2, Working Example 8-2, and Comparative Example 3, unprocessed copper foil with an initial thickness of 18 μm was produced, and, thereafter, copper burn plating and cover plating was carried out by electroplating to produce the roughened surface electrolytic copper foil so that the thickness was 20 μm, and a chromate process was carried out to produce the current collector.

In contrast, for Working Example 1-1, Working Examples 2 to 8-1, Working Examples 9 to 29, Comparative Examples 1 and 2, and Comparative Examples 5 to 8, unprocessed copper foil with a thickness 20 μm was produced, and, thereafter, only a chromate process was carried out, without carrying out burn plating and cover plating, to produce the current collector.

In other words, when the current collectors of Working Examples 1 to 29 and Comparative Examples 1 to 8 were formed, they all had the same thickness of 20 μm.

The conditions for the granular plating to roughen the surface the copper foil, the conditions of the precise copper plating (cover plating), and the conditions of the chromate process were as follows.

Granular Plating Conditions:

| | |
|---|---|
| Copper sulfate | from 80 to 140 g/L |
| Sulfuric acid | from 110 to 160 g/L |
| Additives | as appropriate |
| Liquid temperature | from 30 to 60° C. |
| Current density | from 10 to 50 A/dm$^2$ |
| Processing time | from 2 to 20 seconds |

Precise Copper Plating (Cover Plating) Conditions:

| | |
|---|---|
| Copper sulfate | from 200 to 300 g/L |
| Sulfuric acid | from 90 to 130 g/L |
| Liquid temperature | from 30 to 60° C. |
| Current density | from 10 to 30 A/dm$^2$ |
| Processing time | from 2 to 20 seconds |

Chromate Processing Conditions:

| | |
|---|---|
| Potassium bichromate | from 1 to 10 g/L |
| Immersion processing time | from 2 to 20 seconds |

The tensile strength, 0.2% proof stress, elongation, and surface roughness Ra, Rz of the current collector produced are shown in Table 2.

TABLE 2

Mechanical properties of copper foil

| | Room temperature | | | | | | |
|---|---|---|---|---|---|---|---|
| | S surface | | M surface | | Tensile strength (N/mm²) | 0.2% proof stress (N/mm²) | Elongation (%) |
| | Ra (μm) | Rz (μm) | Ra (μm) | Rz (μm) | | | |
| Working Example 1-1 | 0.38 | 2.15 | 0.38 | 2.10 | 716 | 531 | 2.3 |
| Working Example 1-2 | 0.41 | 2.65 | 0.43 | 2.80 | 715 | 529 | 2.4 |
| Working Example 2 | 0.39 | 2.00 | 0.39 | 2.30 | 711 | 546 | 4.0 |
| Working Example 3 | 0.34 | 1.85 | 0.37 | 2.00 | 713 | 537 | 4.7 |
| Working Example 4 | 0.41 | 2.10 | 0.37 | 1.95 | 684 | 519 | 4.3 |
| Working Example 5 | 0.34 | 1.75 | 0.39 | 2.00 | 661 | 511 | 4.5 |
| Working Example 6 | 0.39 | 2.30 | 0.32 | 1.95 | 658 | 504 | 4.1 |
| Working Example 7 | 0.38 | 2.15 | 0.36 | 2.00 | 678 | 493 | 5.2 |
| Working Example 8-1 | 0.34 | 1.90 | 0.45 | 2.30 | 720 | 487 | 3.5 |
| Working Example 8-2 | 0.40 | 2.65 | 0.50 | 2.80 | 710 | 475 | 3.8 |
| Working Example 9 | 0.37 | 2.10 | 0.45 | 2.20 | 711 | 500 | 3.6 |
| Working Example 10 | 0.35 | 1.80 | 0.45 | 2.50 | 710 | 519 | 4.2 |
| Working Example 11 | 0.33 | 1.90 | 0.46 | 2.75 | 706 | 493 | 3.8 |
| Working Example 12 | 0.39 | 2.00 | 0.30 | 2.20 | 677 | 490 | 5.8 |
| Working Example 13 | 0.39 | 2.00 | 0.40 | 2.10 | 673 | 510 | 5.4 |
| Working Example 14 | 0.42 | 2.65 | 0.43 | 2.33 | 672 | 500 | 4.5 |
| Working Example 15 | 0.35 | 1.60 | 0.33 | 2.10 | 661 | 519 | 4.5 |
| Working Example 16 | 0.34 | 1.65 | 0.40 | 2.50 | 666 | 489 | 4.6 |
| Working Example 17 | 0.20 | 0.80 | 0.35 | 2.15 | 667 | 519 | 4.8 |
| Working Example 18 | 0.34 | 1.80 | 0.40 | 2.50 | 621 | 455 | 3.7 |
| Working Example 19 | 0.35 | 2.00 | 0.41 | 2.55 | 671 | 486 | 3.2 |
| Working Example 20 | 0.35 | 1.65 | 0.34 | 2.05 | 679 | 426 | 3.3 |
| Working Example 21 | 0.34 | 1.65 | 0.33 | 2.05 | 663 | 467 | 3.1 |
| Working Example 22 | 0.32 | 1.60 | 0.30 | 1.80 | 748 | 518 | 3.2 |
| Working Example 23 | 0.30 | 1.01 | 0.35 | 2.30 | 761 | 513 | 4.2 |
| Working Example 24 | 0.34 | 2.05 | 0.32 | 1.70 | 580 | 428 | 5.2 |
| Working Example 25 | 0.33 | 2.00 | 0.27 | 1.50 | 589 | 441 | 6.4 |
| Working Example 26 | 0.30 | 1.80 | 0.32 | 1.65 | 615 | 462 | 4.6 |
| Working Example 27 | 0.33 | 2.10 | 0.34 | 1.90 | 628 | 460 | 5.0 |
| Working Example 28 | 0.40 | 2.30 | 0.38 | 1.90 | 638 | 472 | 4.2 |
| Working Example 29 | 0.40 | 2.40 | 0.40 | 1.95 | 643 | 481 | 4.7 |
| Comparative Example 1 | 0.28 | 1.80 | 0.30 | 1.40 | 318 | 250 | 13.0 |
| Comparative Example 2 | 0.30 | 1.70 | 0.35 | 2.00 | 510 | 345 | 4.5 |
| Comparative Example 3 | 0.50 | 3.50 | 0.60 | 4.50 | 700 | 470 | 4.0 |
| Comparative Example 4 | 0.10 | 0.60 | 0.10 | 0.60 | 405 | 310 | 2.0 |
| Comparative Example 5 | — | — | 0.49 | 3.41 | 531 | 371 | 6.4 |
| Comparative Example 6 | — | — | 0.51 | 3.56 | 530 | 373 | 7.6 |
| Comparative Example 7 | — | — | 0.50 | 4.00 | 515 | 367 | 5.0 |
| Comparative Example 8 | — | — | 0.65 | 6.00 | 453 | 328 | 3.0 |

| | After heating | | |
|---|---|---|---|
| | Tensile strength (N/mm²) | 0.2% proof stress (N/mm²) | Elongation (%) |
| Working Example 1-1 | 528 | 426 | 7.8 |
| Working Example 1-2 | 525 | 421 | 8.0 |
| Working Example 2 | 547 | 436 | 7.9 |
| Working Example 3 | 537 | 448 | 8.7 |
| Working Example 4 | 516 | 428 | 7.8 |
| Working Example 5 | 497 | 400 | 7.2 |
| Working Example 6 | 530 | 430 | 5.4 |
| Working Example 7 | 511 | 413 | 4.1 |
| Working Example 8-1 | 653 | 482 | 2.7 |
| Working Example 8-2 | 645 | 479 | 2.8 |
| Working Example 9 | 480 | 404 | 3.6 |
| Working Example 10 | 357 | 281 | 8.4 |
| Working Example 11 | 292 | 253 | 8.4 |
| Working Example 12 | 412 | 336 | 11.9 |
| Working Example 13 | 405 | 345 | 13.4 |
| Working Example 14 | 411 | 346 | 10.4 |
| Working Example 15 | 406 | 348 | 10.2 |
| Working Example 16 | 412 | 365 | 13.2 |
| Working Example 17 | 413 | 362 | 12.9 |
| Working Example 18 | 323 | 274 | 14.4 |
| Working Example 19 | 328 | 305 | 12.7 |
| Working Example 20 | 355 | 311 | 13.0 |
| Working Example 21 | 344 | 317 | 15.0 |
| Working Example 22 | 390 | 359 | 14.1 |
| Working Example 23 | 430 | 380 | 9.7 |

TABLE 2-continued

Mechanical properties of copper foil

| | | | |
|---|---|---|---|
| Working Example 24 | 373 | 325 | 12.0 |
| Working Example 25 | 392 | 329 | 13.9 |
| Working Example 26 | 377 | 323 | 16.5 |
| Working Example 27 | 376 | 322 | 16.6 |
| Working Example 28 | 362 | 333 | 16.4 |
| Working Example 29 | 386 | 346 | 15.8 |
| Comparative Example 1 | 240 | 150 | 14.4 |
| Comparative Example 2 | 204 | 102 | 13.8 |
| Comparative Example 3 | 640 | 470 | 3.5 |
| Comparative Example 4 | 400 | 305 | 2.0 |
| Comparative Example 5 | 478 | 360 | 5.8 |
| Comparative Example 6 | 320 | 248 | 8.6 |
| Comparative Example 7 | 305 | 226 | 6.6 |
| Comparative Example 8 | 290 | 218 | 3.3 |

The tensile strength, 0.2% proof stress, and elongation are the values measured using a tensile testing machine (model 1122 manufactured by Instron).

The surface roughness Ra, Rz are the values measured using a stylus type surface roughness meter (model SE-3C manufactured by Kosaka Laboratory Ltd.).

Silicon particles with an average particle diameter of 100 nm were used as the active material.

A slurry was prepared by mixing to 64% of the active material, 16% of acethylene black powder (AB), and 20% of a liquid solution of polyamic acid. Next, the slurry as described above was applied to the electrolytic copper foil, so that the coated film was a substantially uniform sheet, dried, compressed in a press machine to obtain close adhesion of the active material layer onto the current collector, and dried again under reduced pressure to produce the test electrodes (negative electrodes). Thereafter, sintering was carried out in an argon atmosphere at the temperatures shown in Table 1, punching to 20 diameter was carried out, to produce electrodes for the secondary battery.

The above electrodes were taken to be the negative electrodes, and 3-electrode cells were produced with metal lithium foil for the counter electrodes and reference electrodes, and a solution of 1.3 mole $LiPF_6$/ethylene carbonate (EC)+ethyl methyl carbonate (EMC)+dimethyl carbonate (DMC) (EC:EMC:DMC=2:5:3 (volume ratio)) as the electrolyte.

Evaluation of the negative electrode of these 3-electrode cells was carried out at 25° C. by the following method.

Charge-Discharge Test Method (1) Calculation of the C Rate

The C (Coulomb) rate of the active material layer in the test electrodes was calculated as follows.

Si:1C=4,000 mAh/g (2) Initial Conditions

Charging: Constant current charging at a current equivalent to 0.1C, after achievement of 0.02 V (opposite Li/Li+), constant voltage charging, terminating when the charging current is 0.05C equivalent or less.

Discharging: Constant current discharging at a current equivalent to 0.1C, terminating at 1.5 V.

(3) Charge-Discharge Cycle Conditions

After the initial charge and discharge tests were carried out, charge-discharge cycles were repeated for 100 cycles at the same 0.1C equivalent current.

The discharge capacity retention ratio of both sides of the current collector after 100 cycles of the above evaluation is shown in Table 3.

The discharge capacity retention ratio after 100 cycles was calculated from the following equation.

(Discharge capacity retention ratio (%) after cycling)=((discharge capacity after cycling)/(maximum discharge capacity))×100

TABLE 3

Discharge capacity retention ratio and occurrence of creases

| | Discharge capacity retention ratio S surface (%) | Discharge capacity retention ratio M surface (%) | Occurrence of creases |
|---|---|---|---|
| Working Example 1-1 | 71 | 73 | Absent |
| Working Example 1-2 | 77 | 78 | Absent |
| Working Example 2 | 73 | 75 | Absent |
| Working Example 3 | 68 | 72 | Absent |
| Working Example 4 | 73 | 70 | Absent |
| Working Example 5 | 70 | 68 | Absent |
| Working Example 6 | 71 | 68 | Absent |
| Working Example 7 | 72 | 72 | Absent |
| Working Example 8-1 | 74 | 76 | Absent |
| Working Example 8-2 | 80 | 80 | Absent |
| Working Example 9 | 73 | 73 | Absent |
| Working Example 10 | 60 | 61 | Absent |
| Working Example 11 | 57 | 58 | Absent |
| Working Example 12 | 63 | 64 | Absent |
| Working Example 13 | 63 | 65 | Absent |
| Working Example 14 | 64 | 64 | Absent |
| Working Example 15 | 63 | 64 | Absent |
| Working Example 16 | 63 | 65 | Absent |
| Working Example 17 | 63 | 66 | Absent |
| Working Example 18 | 61 | 61 | Absent |
| Working Example 19 | 61 | 62 | Absent |
| Working Example 20 | 60 | 63 | Absent |
| Working Example 21 | 60 | 63 | Absent |
| Working Example 22 | 61 | 61 | Absent |
| Working Example 23 | 65 | 67 | Absent |
| Working Example 24 | 60 | 61 | Absent |
| Working Example 25 | 61 | 63 | Absent |

TABLE 3-continued

Discharge capacity retention ratio and occurrence of creases

| | Discharge capacity retention ratio S surface (%) | Discharge capacity retention ratio M surface (%) | Occurrence of creases |
|---|---|---|---|
| Working Example 26 | 59 | 59 | Absent |
| Working Example 27 | 59 | 58 | Absent |
| Working Example 28 | 60 | 60 | Absent |
| Working Example 29 | 60 | 60 | Absent |
| Comparative Example 1 | 42 | 44 | Present |
| Comparative Example 2 | 35 | 38 | Present |
| Comparative Example 3 | 48 | 45 | Absent |
| Comparative Example 4 | 54 | 53 | Absent |
| Comparative Example 5 | — | 35 | Absent |
| Comparative Example 6 | — | 31 | Absent |
| Comparative Example 7 | — | 24 | Absent |
| Comparative Example 8 | — | 20 | Absent |

Also, after cycling, each of the lithium-ion secondary batteries of Working Examples 1 to 29 and Comparative Examples 1 to 8 were dismantled, and the negative electrode current collector of each negative electrode was checked for the occurrence of creasing, and the results are also shown in Table 3.

As shown in Table 3, when either a negative electrode current collector is used that uses unprocessed copper foil that has been (a) heat treated at from 200 to 400° C., and (b) subsequently, has a 0.2% proof stress of 250 N/mm² or more, and elongation of 2.5% or more, and then is (c) rust-proofed on at least one surface thereof, or a negative electrode current collector is used that uses unprocessed copper foil has been heat treated at from 200 to 400° C., and (d) subsequently, has a 0.2% proof stress of 250 N/mm² or more, an elongation of 2.5% or more, and then is (e) roughened and rust-proofed on at least one surface thereof, the result is that the reduction in capacity is low even after repeated charge-discharge cycling.

Also, it was possible to suppress the occurrence of creasing of the current collector due to changing and discharging.

For Working Example 1-2 and Working Example 8-2 in which the surface was given an additional fine nodule treatment, the reduction in capacity after repeated charge-discharge cycling was further reduced.

Comparative Example 1 was an example that used electrolytic copper foil as disclosed in Patent Document 1 (Japanese Patent No. 3742144) in the negative electrode current collector, but the 0.2% proof stress before and after heat treatment was low, so a significant reduction in capacity after repeated charge-discharge cycling occurred. Also, after repeated charging and discharging, creases occurred in the current collector.

In addition, Comparative Example 2 was copper foil with a large tensile strength and 0.2% proof stress at room temperature, but it softened due to heat treatment so the 0.2% proof stress was low, and after repeated charge-discharge cycling, a significant reduction in capacity occurred. Also, creases occurred in the current collector due to repeated charging and discharging.

As shown in Table 2, Comparative Example 3 was roughened too much in the surface roughening treatment, so the charge-discharge efficiency was reduced. This was considered to be because if the surface roughness is too rough, the active material is unable to fill the valley bottom portions of the surface irregularities.

Comparative Example 4 was copper foil with a large tensile strength and 0.2% proof stress at room temperature, that did not soften significantly when heat treated, but its elongation was low. Creasing did not occur in the current collector after repeated charging and discharging, but after repeated charge-discharge cycling, the reduction in capacity was large compared with the electrolytic copper foil according to the First Example set of the present invention.

When the elongation is large, the volumetric swelling and contraction of the active material layer due to repeated charging and discharging of the secondary battery is absorbed, and peeling of the active material from the current collector is suppressed, so it is considered possible to suppress the reduction in charge-discharge cycle efficiency of the secondary battery.

As shown in Table 2, the surface roughness of Comparative Examples 5 to 8 (the roughness of the original foil of Comparative Examples 5 to 8 was rough, so the roughening treatment was not carried out) was too rough, so the charge-discharge efficiency was reduced, the same as for Comparative Example 3.

Looking at the discharge capacity retention ratios in Table 3, the retention ratio reduces as the surface roughness Rz increases. The reason for this is inferred to be because as the surface becomes rough, the active material tends to be unable to fill the valley bottom portions of the surface irregularities.

As described above, when either electrolytic copper foil that has been (a) processed by forming the active material layer that constitutes the negative electrode on the electrolytic copper foil, and (b) after heat treatment at from 200 to 400° C., has a 0.2% proof stress of 250 N/mm² or more and an elongation of 2.5% or more, and is rust-proofed on at least one side thereof, or (c) unprocessed copper foil that after heat treatment at from 200 to 400° C. has a 0.2% proof stress of 250 N/mm² or more and an elongation of 2.5% or more, and (d) is roughened and rust-proofed on at least one side thereof, is used as the electrolytic copper foil as the negative electrode current collector of the lithium-ion secondary battery according to the embodiment of the present invention, the result is, it is possible to provide a lithium-ion secondary battery for which (aa) it is possible to suppress the occurrence of deformation such as creases and the like in the current collector due to charging and discharging, (bb) it is possible to prevent short circuits between the positive electrode and the negative electrode of the lithium-ion secondary battery (cc) reduction in the capacity retention ratio due to repeated charge-discharge cycling does not occur, so the battery has long life, and (dd) the battery can be reduced in size.

The embodiment of the present invention has been described for the case where the active material is silicon, but even when an active material whose main component is a silicon oxide, carbon, germanium, or tin is used, it is possible to provide a lithium-ion secondary battery that can suppress the occurrence of deformation such as creases and the like due to charging and discharging, can prevent short circuits between the positive electrode and the negative electrode of the lithium-ion secondary battery, and for which there is no reduction of the capacity retention ratio due to repeated charging and discharging, that has long life, and can be reduced in size.

SECOND EMBODIMENT

Based on the results of the analyses described below and diligent research into the relationship between the chlorine, carbon, oxygen, sulfur, and nitrogen content included in a copper foil and the mechanical strength, the copper foil according to the second embodiment of the present invention is a copper foil that includes chlorine, carbon C, and oxygen at concentrations of $10^{17}$ to $5 \times 10^{20}$ atoms/cm$^3$ each, sulfur S and nitrogen N at concentrations of $10^{15}$ to $10^{19}$ atoms/cm$^3$ each, and under normal conditions the copper foil has a tensile strength of 580 N/mm$^2$ or more and a 0.2% proof stress of 250 N/mm$^2$ or more, so it is the copper foil with excellent mechanical strength.

It was not possible to satisfy the above mechanical strength when the electrolytic copper foil was outside the atomic content described above. The superiority and inferiority of the mechanical strength is described later with reference to the Second Working Example set and the Second Comparative Example set.

Measurement of the atomic content described above is the result of analysis of the copper foil in the thickness direction by secondary ion mass spectroscopy (SIMS) in the depth profile (depth direction).

SIMS analysis can analyze the elements by irradiating the surface of a test specimen with primary ions to cause sputtering, and analyzing the mass of the secondary ions emitted from the surface. High sensitivity concentration analysis can be carried out for the profile in the depth direction. Cesium ions, oxygen ions, and argon ions are used in the primary ion beam. By comparing the analysis results with the results for a standard sample, the composition concentrations are quantitatively determined.

Also, preferably, the copper foil according to the embodiment of the present invention has a crystal grain diameter when observed in cross-section in the copper foil thickness direction in the range of from 20 to 2500 nm. The crystal grain diameter when observed in cross-section in the copper foil thickness direction is measured from a scanning ion microscope (SIM) image.

The copper foil according to the embodiment of the present invention exhibits an excellent effect as a current collector, in particular, for layering active material with large swelling and contraction adopted for the electrode for a non-aqueous secondary battery.

The copper foil according to the embodiment of the present invention has, under normal conditions, a tensile strength of from 580 to 1000 N/mm$^2$, and a 0.2% proof stress of from 350 to 800 N/mm$^2$, and after heat treatment at from 200 to 400° C., the tensile strength is from 400 to 800 N/mm$^2$, and after the heat treatment, the 0.2% proof stress is from 250 to 600 N/mm$^2$.

Therefore, when this copper foil is used as the current collector, deformation such as creases or the like and breakage do not occur even when subjected to stress due to swelling and expansion of the active material layer associated with the storage and discharge of lithium.

From the results of the analyses described with reference to FIG. 4, the mechanical properties exhibited by the copper foil according to the embodiment of the present invention are achieved by including chlorine (Cl), carbon (C), and oxygen (O) in the concentration of $10^{17}$ to $5 \times 10^{20}$ atoms/cm$^3$ each, and sulfur (S) and nitrogen (N) in the concentration of $10^{15}$ to $5 \times 10^{19}$ atoms/cm$^3$ each.

Quantitative determination of these elements can be carried out by analyzing the depth profile (depth direction) in the copper foil thickness direction using a secondary ion mass spectroscope (SIMS).

In addition, as shown in FIG. 1, preferably, the crystal grain diameter when observed in cross-section of the copper foil according to the embodiment of the present invention is not more than 4000 nm, and more preferably in the range of from 20 to 3500 nm, as a result of measuring the grain diameter from a clear scanning ion microscope (SIM) image by irradiating the surface with a focused ion beam (FIB).

Also, preferably, the copper foil according to the embodiment of the present invention is electrolytic copper foil produced by an electrolytic deposition method. This is because by producing the copper foil by electrolytic deposition, it is possible to effectively incorporate each of the elements in the copper foil by electrolytic deposition. Also, preferably, the electrolytic copper foil is rolled copper foil.

It is possible to produce rolled copper foil, but it is quite difficult to effectively incorporate each of the elements as specified.

Second Working Example Set

The Second Working Example set is the same as the First Working Example set as described above, but the following examples and comparative examples were produced in accordance with the conditions shown in the following table.

Working Examples 1a to 10a, Comparative Examples 1a to 4a

Manufacture of Copper Foil

Each of the additive compositions shown in Table 4 were added to an acidic copper electrolytic bath of copper from 70 to 130 g/L and sulfuric acid from 80 to 140 g/L.

In table 4, ethylene thiourea as the thiourea, hydroxyethyl cellulose as the polymer polysaccharide, and chloride ion were added in the concentrations shown in Table 4 to prepare an electrolytic solution for producing the foil.

The chloride ion concentration was adjusted to 30 ppm, but the chloride ion concentration was changed as appropriate in accordance with the electrolysis conditions, so there was no limit to this concentration.

Using the prepared electrolytic solution, and using a titanium electrode covered with a noble metal oxide as the anode, and a titanium rotating drum as the cathode, unprocessed copper foils with a thickness of 18 μm were produced under the electrolysis conditions shown in Table 4 (current density, liquid temperature), as the copper foils for Working Examples 1a to 4a and Comparative Example 1a.

Likewise, unprocessed copper foils with a area weight of 20 μm were produced for Working Examples 5a to 10a.

Also, unprocessed copper foils with a thickness of 20 μm were produced using the electrolytic solution with the composition indicated in Table 4 for Comparative Examples 2a to 3a.

TABLE 4

Production conditions of copper foil for negative electrode current collector

| | A | | B | |
|---|---|---|---|---|
| | Additive type | (ppm) | Additive type | (ppm) |
| Working Example 1a | Thiourea | 1-10 | — | — |
| Working Example 2a | Thiourea | 1-10 | Polyacrylamide | 1-20 |
| Working Example 3a | N,N'-dimethylthiourea | 1-10 | Polyethyleneimine | 1-20 |
| Working Example 4a | N,N'-dimethylthiourea | 1-10 | Polyacrylamide | 1-20 |
| Working Example 5a | Tetramethylthiourea | 1-10 | Gelatine | 1-20 |
| Working Example 6a | Tetramethylthiourea | 1-10 | Polyethyleneglycol | 1-20 |
| Working Example 7a | Ethylenethiourea | 1-10 | Starch | 1-20 |
| Working Example 8a | Ethylenethiourea | 1-10 | Hydroxyethyl cellulose | 1-20 |
| Working Example 9a | Ethylenethiourea | 1-10 | Polyethyleneimine | 1-20 |
| Working Example 10a | Ethylenethiourea | 1-10 | Polyacrylamide | 1-20 |
| Comparative Example 1a | Ethylenethiourea | 1 | — | — |
| Comparative Example 2a | — | — | — | — |
| Comparative Example 3a | — | — | — | — |
| Comparative Example 4a | — | — | — | — |

| | MPS (ppm) | Gelatine (ppm) | HEC (ppm) | Chlorine (ppm) | Current density (A/dm$^2$) | Liquid temperature (° C.) |
|---|---|---|---|---|---|---|
| Working Example 1a | — | — | — | 30.0 | 40 | 50 |
| Working Example 2a | — | — | — | 30.0 | 40 | 50 |
| Working Example 3a | — | — | — | 30.0 | 40 | 50 |
| Working Example 4a | — | — | — | 30.0 | 40 | 50 |
| Working Example 5a | — | — | — | 30.0 | 40 | 50 |
| Working Example 6a | — | — | — | 30.0 | 40 | 50 |
| Working Example 7a | — | — | — | 30.0 | 40 | 50 |
| Working Example 8a | — | — | — | 30.0 | 40 | 50 |
| Working Example 9a | — | — | — | 30.0 | 40 | 50 |
| Working Example 10a | — | — | — | 30.0 | 40 | 50 |
| Comparative Example 1a | — | — | 2.0 | 30.0 | 40 | 50 |
| Comparative Example 2a | — | — | 5.0 | 30.0 | 40 | 50 |
| Comparative Example 3a | 1 | 4 | 4 | 30.0 | 40 | 50 |
| Comparative Example 4a | — | — | — | 30.0 | 40 | 50 |

| | Roughening process | Heating temperature (° C.) |
|---|---|---|
| Working Example 1a | Performed | 230° C. × 1.5 h |
| Working Example 2a | Not performed | 400° C. × 0.5 h |
| Working Example 3a | Not performed | 300° C. × 1 h |

TABLE 4-continued

| Production conditions of copper foil for negative electrode current collector | | |
|---|---|---|
| Working Example 4a | Not performed | 300° C. × 1 h |
| Working Example 5a | Not performed | 300° C. × 1 h |
| Working Example 6a | Not performed | 300° C. × 1 h |
| Working Example 7a | Not performed | 300° C. × 1 h |
| Working Example 8a | Not performed | 300° C. × 1 h |
| Working Example 9a | Not performed | 300° C. × 1 h |
| Working Example 10a | Not performed | 300° C. × 1 h |
| Comparative Example 1a | Performed | 200° C. × 1.5 h |
| Comparative Example 2a | Not performed | 300° C. × 1 h |
| Comparative Example 3a | Not performed | 300° C. × 1 h |
| Comparative Example 4a | Not performed | 300° C. × 1 h |

Production of the Negative Electrode Current Collector

A granular copper plating layer was formed on the surface of the electrolytic copper foil shown in Table 4 by burn plating by electroplating. In addition, a flat copper plating (capsule plating) was carried out on the granular copper plating layer so as not to damage the irregular shape, to produce a roughened surface copper foil with improved adhesion between the granular copper and the copper foil.

As described above, for Working Examples 1a to 4a and Comparative Example 1a, unprocessed copper foils with an initial thickness of 18 μm were produced, and thereafter copper burn plating and capsule plating were carried out by electroplating to produce the roughened surface electrolytic copper foil, and after a chromate process was carried out, the current collector was produced so that the thickness was 20 μm.

In contrast, for Working Examples 5a to 10a and Comparative Examples 2a to 4a, unprocessed copper foils with a thickness of 20 μm were produced, and thereafter only a chromate process was carried out, without carrying out burn plating and capsule plating, to produce the current collector.

In other words, when the current collectors for Working Examples 1a to 10a and Comparative Examples 1a to 4a were produced so that they all had the same thickness of 20 μm.

The burn plating (granular plating) conditions for surface roughening the copper foil, the capsule plating (flat copper plating) conditions, and the chromate process conditions were as follows.

Burn Plating (Granular Plating) Conditions

| Copper sulfate | from 80 to 140 g/L |
|---|---|
| Sulfuric acid | from 110 to 160 g/L |
| Additives | as appropriate |
| Liquid temperature | from 30 to 60° C. |
| Current density | from 10 to 50 A/dm$^2$ |
| Processing time | from 2 to 20 seconds |

Capsule Plating (Flat Copper Plating) Conditions

| Copper sulfate | from 200 to 300 g/L |
|---|---|
| Sulfuric acid | from 90 to 130 g/L |
| Liquid temperature | from 30 to 60° C. |
| Current density | from 10 to 30 A/dm$^2$ |
| Processing time | from 2 to 20 seconds |

Chromate Processing Conditions

| Potassium bichromate | from 1 to 10 g/L |
|---|---|
| Immersion processing time | from 2 to 20 seconds |

The tensile strength, 0.2% proof stress, elongation, and surface roughness Ra, Rz of each of the working examples and comparative examples produced are shown in Table 5.

TABLE 5

| Mechanical properties of copper foil | | | | | | | |
|---|---|---|---|---|---|---|---|
| | | | | | Room temperature | | |
| | S surface | | M surface | | Tensile | 0.2% proof | Elonga- |
| | Ra (μm) | Rz (μm) | Ra (μm) | Rz (μm) | strength (N/mm$^2$) | stress (N/mm$^2$) | tion (%) |
| Working Example 1a | 0.41 | 2.65 | 0.43 | 2.80 | 715 | 529 | 2.4 |
| Working Example 2a | 0.33 | 1.90 | 0.46 | 2.75 | 706 | 493 | 3.8 |
| Working Example 3a | 0.34 | 1.65 | 0.40 | 2.50 | 666 | 489 | 4.6 |
| Working Example 4a | 0.20 | 0.80 | 0.35 | 2.15 | 667 | 519 | 4.8 |
| Working Example 5a | 0.34 | 1.80 | 0.40 | 2.50 | 621 | 455 | 3.7 |
| Working Example 6a | 0.35 | 2.00 | 0.41 | 2.55 | 671 | 486 | 3.2 |
| Working Example 7a | 0.30 | 1.80 | 0.32 | 1.65 | 615 | 462 | 4.6 |
| Working Example 8a | 0.33 | 2.10 | 0.34 | 1.90 | 628 | 460 | 5.0 |

TABLE 5-continued

Mechanical properties of copper foil

| | | | | | | | |
|---|---|---|---|---|---|---|---|
| Working Example 9a | 0.40 | 2.30 | 0.38 | 1.90 | 638 | 472 | 4.2 |
| Working Example 10a | 0.40 | 2.40 | 0.40 | 1.95 | 643 | 481 | 4.7 |
| Comparative Example 1a | 0.44 | 2.40 | 0.42 | 2.07 | 475 | 358 | 5.2 |
| Comparative Example 2a | 0.28 | 1.80 | 0.30 | 1.40 | 300 | 230 | 15.0 |
| Comparative Example 3a | 0.28 | 1.80 | 0.30 | 1.40 | 318 | 250 | 13.0 |
| Comparative Example 4a | 0.30 | 1.70 | 0.35 | 2.00 | 510 | 345 | 4.5 |

After heating

| | Tensile strength (N/mm$^2$) | 0.2% proof stress (N/mm$^2$) | Elongation (%) |
|---|---|---|---|
| Working Example 1a | 525 | 421 | 8.0 |
| Working Example 2a | 292 | 253 | 8.4 |
| Working Example 3a | 412 | 365 | 13.2 |
| Working Example 4a | 413 | 362 | 12.9 |
| Working Example 5a | 323 | 274 | 14.4 |
| Working Example 6a | 328 | 305 | 12.7 |
| Working Example 7a | 377 | 323 | 16.5 |
| Working Example 8a | 376 | 322 | 16.6 |
| Working Example 9a | 362 | 333 | 16.4 |
| Working Example 10a | 386 | 346 | 15.8 |
| Comparative Example 1a | 321 | 230 | 7.8 |
| Comparative Example 2a | 250 | 170 | 5.0 |
| Comparative Example 3a | 240 | 150 | 14.4 |
| Comparative Example 4a | 204 | 102 | 13.8 |

The tensile strength, 0.2% proof stress, and elongation are the values measured using a tensile testing machine (model 1122, manufactured by Instron). Also, the surface roughness values Ra, Rz were measured using a stylus type surface roughness meter (model SE-3C, manufactured by Kosaka Laboratory Ltd.).

Table 6 shows the results of analysis in the depth direction by SIMS for the copper foils of the working examples and comparative examples produced, and in addition, Table 6 includes the values of the crystal grain diameter from observation of focused ion beam (FIB) cross-section SIM images as shown in FIG. 1.

Figure 2:
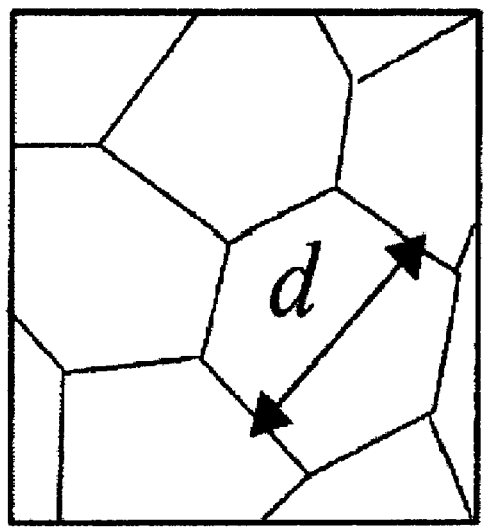
FIG. 2 shows the definition of crystal grain diameter.
Figure 3:
FIG. 3 shows a TEM image of the precipitated phase (domain).

FIG. 2 shows the definition of the crystal grain diameter, and FIG. 3 shows a TEM image of a precipitated phase (domain).

TABLE 6

Copper foil impurity analysis and cross-section crystal grain diameter measurement results

| | SIMS depth direction analysis results (atoms/cm$^3$) | | | | | Cross-section crystal grain diameter (nm) |
|---|---|---|---|---|---|---|
| | Cl Chlorine | C Carbon | O Oxygen | S Sulfur | N Nitrogen | After heating Small-Large |
| Working Example 1a | $10^{17}$ | $10^{17}$ | $10^{18}$ | $10^{19}$ | $2*10^{18}$ | 400-2500 |
| Working Example 2a | $5*10^{17}$ | $5*10^{17}$ | $10^{18}$ | $5*10^{18}$ | $10^{17}$ | 350-2200 |
| Working Example 3a | $5*10^{18}$ | $10^{20}$ | $5*10^{18}$ | $5*10^{19}$ | $5*10^{18}$ | 500-1800 |
| Working Example 4a | $5*10^{20}$ | $2*10^{18}$ | $10^{19}$ | $5*10^{17}$ | $5*10^{17}$ | 400-1300 |
| Working Example 5a | $10^{18}$ | $10^{19}$ | $5*10^{20}$ | $2*10^{18}$ | $5*10^{19}$ | 200-1000 |
| Working Example 6a | $10^{20}$ | $5*10^{17}$ | $2*10^{20}$ | $2*10^{19}$ | $10^{19}$ | 250-1000 |
| Working Example 7a | $10^{18}$ | $2*10^{20}$ | $10^{19}$ | $10^{15}$ | $10^{15}$ | 100-1000 |
| Working Example 8a | $2*10^{19}$ | $5*10^{18}$ | $3*10^{19}$ | $3*10^{18}$ | $5*10^{15}$ | 50-1000 |
| Working Example 9a | $10^{20}$ | $3*10^{18}$ | $10^{19}$ | $3*10^{19}$ | $3*10^{17}$ | 20-1000 |
| Working Example 10a | $3*10^{19}$ | $10^{20}$ | $2*10^{19}$ | $10^{17}$ | $5*10^{16}$ | 30-1000 |
| Comparative Example 1a | $10^{17}$ | $10^{17}$ | $10^{17}$ | $10^{14}$ | $10^{14}$ | 550-3500 |
| Comparative Example 2a | $10^{17}$ | $10^{18}$ | $10^{17}$ | $10^{11}$ | $10^{11}$ | 650-8000 |
| Comparative Example 3a | $10^{18}$ | $10^{20}$ | $10^{20}$ | $10^{13}$ | $10^{12}$ | 600-5500 |
| Comparative Example 4a | $10^{16}$ | $10^{15}$ | $10^{16}$ | $10^{10}$ | $10^{10}$ | 1000-10000 |

Production of Negative Electrodes

Silicon powder with an average particle diameter of 15 μm (purity 99.9%) was used as the negative electrode active material powder, polyimide was used as the binder, the negative electrode active material powder and the binder were added in the weight ratio of 9:1 to N-methyl-2-pyrrolidone and these ingredients were mixed to prepare a negative electrode compound slurry.

Next, the negative electrode compound slurry was applied to the copper foil that was to become the current collector, and dried to form a negative electrode compound layer on both sides of the negative electrode current collector. At this time, the electrode thickness was 85 μm.

Then after rolling with a roller to an electrode thickness of 60 μm, sintering was carried out at the temperatures shown in Table 4 for one hour in an argon atmosphere to produce the negative electrodes.

Production of Positive Electrodes $Li_2Co_3$ and $CoCo_3$ were used to produce the positive electrode active material, the compounds were weighed to produce an atomic ratio Li:Co of 1:1, then mixed in a mortar, then after pressure forming by pressing in a 17 mm diameter mold, the product was sintered in air at 800° C. for 24 hours to produce an $LiCoO_2$ sintered product, this $LiCoO_2$ sintered product was comminuted in a mortar, to produce an $LiCoO_2$ powder with an average particle diameter of 20 μm.

To 90 parts by weight of the positive electrode active material powder comprising $LiCoO_2$ powder, N-methyl-2-pyrrolidone solvent of 5% by weight including 5 parts by weight of the conducting agent artificial graphite powder, and 3 parts by weight of the binding agent polyvinylidene fluoride was mixed to prepare the positive electrode compound slurry.

Next, the positive electrode compound slurry was applied to a positive electrode current collector made from 15 μm aluminum foil, dried, and rolled, to produce the positive electrode with the positive electrode compound layer formed on both sides of the positive electrode current collector.

Production of Non-Aqueous Electrolyte

To produce the non-aqueous electrolyte, $LiPF_6$ was dissolved in a mixed solvent of ethylene carbonate and diethylene carbonate mixed in the proportions 3:7 by volume, to achieve a concentration of 1 mole per liter, in addition, carbon dioxide was blown into the solution for 10 minutes at 25° C., so that the carbon dioxide was dissolved until saturation.

Evaluation of the Battery Charge Discharge Properties

Lithium-ion secondary batteries were produced using the negative electrodes, positive electrodes, and non-aqueous electrolyte described above, and the charge-discharge properties were evaluated.

To produce the lithium-ion secondary batteries, positive electrode current collection tabs made from aluminum were fitted to the positive electrodes described above, and negative electrode current collection tabs made from nickel were fitted to the negative electrodes described above, the positive electrode and negative electrode were placed in opposition to each other with a porous separator made from polyethylene disposed therebetween, and wound up to form an electrode body.

Next, the electrode body described above was inserted into an external container made from aluminum laminated film, the non-aqueous electrolyte described above was added to the external container, then the aperture of the external container was closed so that the positive electrode current collection tab and the negative electrode current collection tab were led out.

Next, the lithium-ion secondary batteries of Working Examples 1a to 10a and Comparative Examples 1a to 4a produced as described above were charged to 4.2 V at a current value of 1000 mA in a 25° C. environment, then discharged to 2.75 V at a current value of 1000 mA, and taking this to be one cycle, charging and discharging was repeated, and the number of cycles was measured until the discharge capacity reached 70% of the discharge capacity of the first cycle, and this number was taken to be the cycle life.

The results are shown in Table 7, taking the cycle life of the lithium-ion secondary battery of Working Example 1a to be an index of 100.

After cycling, each lithium battery according to Working Examples 1a to 10a and Comparative Examples 1a to 4a was dismantled, and the negative electrode current collector of each negative electrode was checked for the occurrence of creasing, and the results are also shown in Table 7.

TABLE 7

Discharge capacity retention ratio and occurrence of creasing

| | Discharge capacity retention ratio S surface (%) | Discharge capacity retention ratio M surface (%) | Occurrence of creasing |
|---|---|---|---|
| Working Example 1a | 77 | 78 | Absent |
| Working Example 2a | 57 | 58 | Absent |
| Working Example 3a | 63 | 65 | Absent |
| Working Example 4a | 63 | 66 | Absent |
| Working Example 5a | 61 | 61 | Absent |
| Working Example 6a | 61 | 62 | Absent |
| Working Example 7a | 59 | 59 | Absent |
| Working Example 8a | 59 | 58 | Absent |
| Working Example 9a | 60 | 60 | Absent |
| Working Example 10a | 60 | 60 | Absent |
| Comparative Example 1a | 45 | 47 | Present |
| Comparative Example 2a | 37 | 41 | Present |
| Comparative Example 3a | 48 | 45 | Absent |
| Comparative Example 4a | 54 | 53 | Absent |

Figure 4:
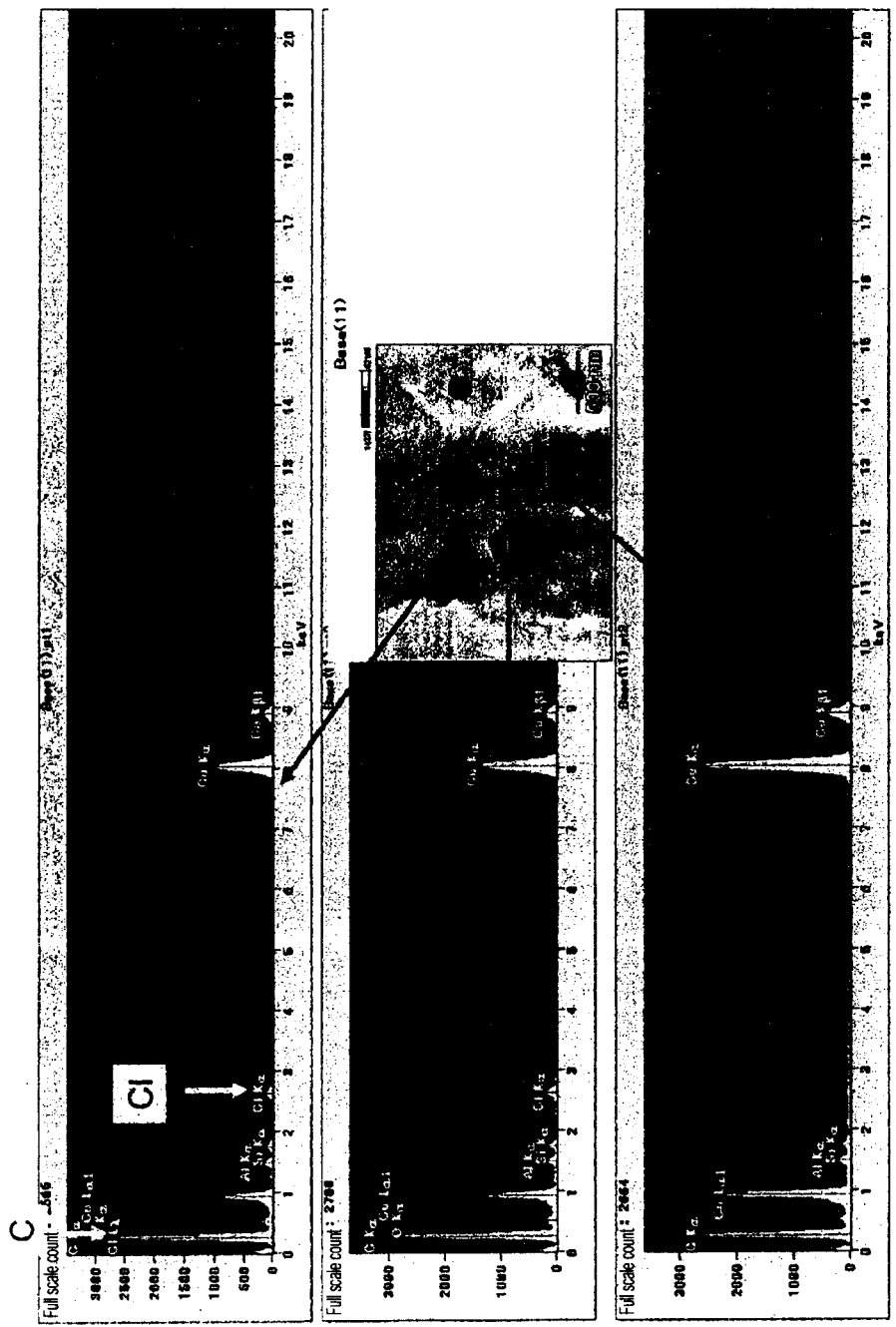
FIG. 4 shows a TEM image and EDX element (distribution) analysis (the black locations are precipitated phase or domains of 100 nm or more)

As shown in Table 7, in Working Examples 1a to 10a of the present invention, as shown in FIG. 4, the results of SIMS analysis in the depth direction of the thickness direction of the copper foil confirm that when copper foil with concentrations of chlorine (Cl) of $10^{17}$ to $5 \times 10^{20}$ atoms/cm$^3$, carbon (C) of $10^{17}$ to $5 \times 10^{20}$ atoms/cm$^3$, oxygen (O) of $10^{17}$ to $5 \times 10^{20}$ atoms/cm$^3$, sulfur (S) of $10^{15}$ to $5 \times 10^{19}$ atoms/cm$^3$, and nitrogen (N) of $10^{15}$ to $5 \times 10^{19}$ atoms/cm$^3$ was used, reduction of capacity due to repeated charge-discharge cycling did not occur, and also that it was possible to suppress the occurrence of creases in the current collector due to charging and discharging.

Also, when copper foil that under normal conditions exhibits tensile strength of from 580 to 800 N/mm$^2$, and a 0.2% proof stress of from 400 to 800 N/mm$^2$, and after heat treatment at from 200 to 400° C., exhibits a tensile strength of from 400 to 800 N/mm$^2$, and a 0.2% proof stress after the heat treatment described above of from 250 to 600 N/mm$^2$ was used, reduction in capacity due to repeated charge-discharge cycling did not occur, and the occurrence of creases in the current collector due to charging and discharging was suppressed.

In addition, when copper foil having a crystal grain diameter when observed in cross-section in the copper foil thickness direction on a SIM image in the range of from 20 to 2500 nm was used, reduction in capacity due to repeated charge-discharge cycling did not occur, and, the occurrence of creases in the current collector due to charging and discharging was suppressed.

Comparative Example 1a was an example in which electrolytic copper foil as disclosed in Patent Document 1 was used as the negative electrode current collector, before and after heat treatment, the 0.2% proof stress was comparatively high but was 250 N/mm² or less, and after repeated charging and discharging creases occurred on the current collector.

In addition, Comparative Examples 2a to 4a were copper foil with comparatively high tensile strength but low 0.2% proof stress at room temperature, that softened after heat treatment, so the 0.2% proof stress was low, so creases occurred in the current collector due to repeated charging and discharging.

As described above, using the copper foil according to the embodiment of the present invention, when a negative electrode current collector that has been rust-proofed on at least one side thereof is used, it is possible to suppress the occurrence of deformation such as creases or the like on the current collector due to charging and discharging, and it is possible to prevent short circuits between the positive electrode and the negative electrode of the lithium-ion secondary battery, so it is possible to provide a lithium-ion secondary battery whose capacity does not reduce due to repeated charge-discharge cycling, that has a long life, and that can be reduced in size.

The Second Working Example set has been described for the case where the active material is silicon, but even when an active material whose main component is a silicon oxide, carbon, or tin is used, it is possible to provide a lithium-ion secondary battery that suppresses the occurrence of deformation such as creases and the like due to charging and discharging n the current collector, prevents short circuits between the positive electrode and the negative electrode of the lithium-ion secondary battery, and for which there is no reduction of the capacity due to repeated charge-discharge cycling, that has long life, and that can be reduced in size.

The copper foil according to the second embodiment of the present invention can be laminated onto a rigid or flexible insulating board, and used as a printed circuit board.

THIRD EMBODIMENT

The third embodiment of the present invention is a copper foil having an average overall copper purity of 95 to 99.999% by mass, including a precipitated phase or domains of from 1 to 500 nm in size in which the detected content of Cu component is low compared with the Cu concentration of the surrounding matrix, when observed on a transmission electron microscope (TEM) image or on a scanning transmission electron microscope (STEM) image, as described below.

Preferably, the copper foil includes the domains of from 1 to 150 nm in size in which the detected content of the Cu component is low compared with the surrounding matrix.

Also, preferably, the copper foil includes the domains whose Cu content is low compared with the surroundings including mainly carbon C.

Also, preferably, the copper foil includes the domains whose Cu content is lower than the surroundings and whose main component is carbon C further including sulfur S or chlorine Cl or nitrogen N.

The copper foil has the crystal grain size when observed in cross-section in the copper foil thickness direction on a scanning ion microscope (SIM) image being in the range of from 20 to 3500 nm.

The following is further detailed description of the third embodiment of the present invention with reference to the Third Working Example set and the Third Comparative Example set.

Third Working Example Set

The Third Working Example set and the Third Comparative Example set were basically the same as the First Working Example set, but were produced under the conditions shown in the following table.

Working Examples 1b to 10b, Comparative Examples 1b to 4b

Production of Copper Foil

Each of the additive compositions shown in Table 8 were added to an acidic copper electrolytic bath of copper of from 70 to 130 g/L and sulfuric acid of from 80 to 140 g/L.

In Table 8, additive A is thiourea, N,N'-dimethyl thiourea, tetramethyl thiourea, or ethylene thiourea, and additive B is polyacrylamide, polyethylene imide, gelatine, polyethylene glycol, or hydroxyethyl cellulose.

In the comparative examples, the only additives used were MPS, gelatine, and HEC, which were each added so that the chloride ion concentration was as shown in Table 8 to prepare the electrolytic solution for the copper foil.

The chloride ion concentration was adjusted to 30 ppm, but the chloride ion concentration was changed as appropriate in accordance with the electrolysis conditions, so there was no limit to this concentration.

Using the prepared electrolytic solution, and using a titanium electrode covered with a noble metal oxide as the anode, and a titanium rotating drum as the cathode, unprocessed copper foils with a thickness of 18 μm were produced under the electrolysis conditions shown in Table 8 (current density, liquid temperature), for the copper foil for Working Examples 1b to 4b and Comparative Example 1b.

Likewise, unprocessed copper foils with a area weight of 20 μm were produced for Working Examples 5b to 10b. Also, unprocessed copper foils were produced using the electrolytic solution with the composition indicated in Table 1 for Comparative Examples 2b to 3b.

TABLE 8

| Conditions for production of copper foil for negative electrode current collector | | | | |
|---|---|---|---|---|
| A | | | B | |
| Additive type | (ppm) | Addiutive type | (ppm) |
| Working Example 1b | Thiourea | 1-10 | — | — |
| Working Example 2b | Thiourea | 1-10 | Polyacrylamide | 1-20 |

TABLE 8-continued

Conditions for production of copper foil for negative electrode current collector

| | | | | | |
|---|---|---|---|---|---|
| Working Example 3b | N,N'-dimethylthiourea | 1-10 | Polyethyleneimine | 1-20 | |
| Working Example 4b | N,N'-dimethylthiourea | 1-10 | Polyacrylamide | 1-20 | |
| Working Example 5b | Tetramethylthiourea | 1-10 | Gelatine | 1-20 | |
| Working Example 6b | Tetramethylthiourea | 1-10 | Polyethyleneglycol | 1-20 | |
| Working Example 7b | Ethylenethiourea | 1-10 | Starch | 1-20 | |
| Comparative Example 1b | Ethylenethiourea | 2 | — | — | |
| Comparative Example 2b | Ethylenethiourea | 5 | — | — | |
| Comparative Example 3b | — | — | — | — | |
| Comparative Example 4b | — | — | — | — | |

| | MPS (ppm) | Gelatine (ppm) | HEC (ppm) | Chlorine (ppm) | Current density (A/dm$^2$) | Liquid temperature (° C.) | Heating temperature (° C.) |
|---|---|---|---|---|---|---|---|
| Working Example 1b | — | — | — | 30.0 | 30-70 | 40-60 | 230° C. × 1.5 h |
| Working Example 2b | — | — | — | 30.0 | 30-70 | 40-60 | 400° C. × 0.5 h |
| Working Example 3b | — | — | — | 30.0 | 30-70 | 40-60 | 300° C. × 1 h |
| Working Example 4b | — | — | — | 30.0 | 30-70 | 40-60 | 300° C. × 1 h |
| Working Example 5b | — | — | — | 30.0 | 30-70 | 40-60 | 300° C. × 1 h |
| Working Example 6b | — | — | — | 30.0 | 30-70 | 40-60 | 300° C. × 1 h |
| Working Example 7b | — | — | — | 30.0 | 30-70 | 40-60 | 300° C. × 1 h |
| Comparative Example 1b | — | — | 1.0 | 30.0 | 30-70 | 40-60 | 200° C. × 1.5 h |
| Comparative Example 2b | — | — | — | 30.0 | 30-70 | 40-60 | 300° C. × 1 h |
| Comparative Example 3b | 1 | 4 | 4 | 30.0 | 30-70 | 40-60 | 300° C. × 1 h |
| Comparative Example 4b | — | — | — | 30.0 | 30-70 | 40-60 | 300° C. × 1 h |

Some of the produced copper foil in Table 8 was sampled and directly observed by STEM image, and qualitative analysis of the precipitated phase (or domains) that were observed was carried out by EDX or by EELS.

Figure 5:
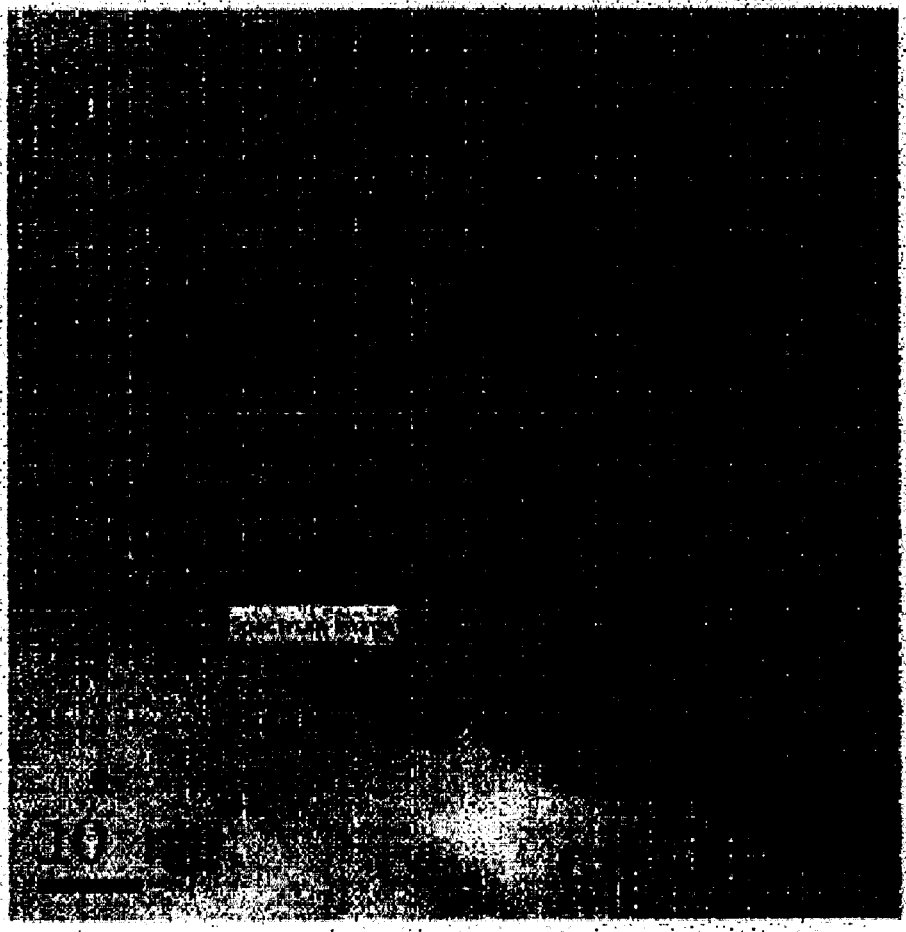
FIG. 5 shows a STEM image and EELS element analysis (the black locations are precipitated phase or domains of 100 nm or less)

The results are shown in FIG. 4, FIG. 5, and FIG. 6.

In each of the precipitated phases, the quantity of copper detected was lower than that of the matrix copper, and the main component was found to be carbon (C).

The elements detected are shown in Table 8, and in addition, the approximate values of the crystal grain diameter obtained by observation of the focused ion beam (FIB) cross-section SIM image as shown in FIG. 1 are shown.

Apart from carbon (C), the elements detected in the precipitated phase included chlorine, sulfur, and oxygen, but the subsidiary detected elements differed depending on the domain.

The capability of detecting nitrogen in qualitative analysis is low, but its presence was confirmed by SIMS.

Also, it was confirmed that the copper purity of each of the copper foils was 99% or more by ICP emission spectroscopic analysis.

Production of Negative Electrode Current Collector

A granular copper plating layer was formed on the surface of the electrolytic copper foil shown in Table 8 by burn plating by electroplating. In addition, a flat copper plating (capsule plating) was carried out on the granular copper plating layer so as not to damage the irregular shape, to produce a roughened surface copper foil with improved adhesion between the granular copper and the copper foil.

As described above, for Working Examples 1b to 4b and Comparative Example 1b, unprocessed copper foils with an initial thickness of 18 μm were produced, and thereafter copper burn plating and capsule plating were carried out by electroplating to produce the roughened surface electrolytic copper foil, and after a chromate process was carried out to produce the current collector was produced so that the thickness was 20 m.

In contrast, for Working Examples 5b to 7b and Comparative Examples 2b to 4b, unprocessed copper foil with a thickness of 20 μm was produced, and thereafter only a chromate process was carried out, without carrying out burn plating and capsule plating, to produce the current collector.

In other words, when the current collectors for Working Examples 1b to 7b and Comparative Examples 1b to 4b were formed so that they all had the same thickness of 20 μm.

The burn plating (granular plating) conditions for surface roughening the copper foil, the capsule plating (flat copper plating) conditions, and the chromate process conditions were as follows.

Burn Plating (Granular Plating) Conditions

| | |
|---|---|
| Copper sulfate | from 80 to 140 g/L |
| Sulfuric acid | from 110 to 160 g/L |
| Additives | as appropriate |
| Liquid temperature | from 30 to 60° C. |
| Current density | from 10 to 50 A/dm² |
| Processing time | from 2 to 20 seconds |

Capsule Plating (Flat Copper Plating) Conditions

| | |
|---|---|
| Copper sulfate | from 200 to 300 g/L |
| Sulfuric acid | from 90 to 130 g/L |
| Liquid temperature | from 30 to 60° C. |
| Current density | from 10 to 30 A/dm² |
| Processing time | from 2 to 20 seconds |

Chromate Processing Conditions

| | |
|---|---|
| Potassium bichromate | from 1 to 10 g/L |
| Immersion processing time | from 2 to 20 seconds |

The tensile strength, 0.2%, elongation, and surface roughness Ra, Rz of each of the working examples and comparative examples produced are shown in Table 9.

TABLE 9

Mechanical properties of copper foil

| | S surface | | M surface | | Room temperature | | |
|---|---|---|---|---|---|---|---|
| | Ra (μm) | Rz (μm) | Ra (μm) | Rz (μm) | Tensile strength (N/mm²) | 0.2% proof stress (N/mm²) | Elongation (%) |
| Working Example 1b | 0.41 | 2.65 | 0.43 | 2.80 | 715 | 529 | 2.4 |
| Working Example 2b | 0.33 | 1.90 | 0.46 | 2.75 | 706 | 493 | 3.8 |
| Working Example 3b | 0.34 | 1.65 | 0.40 | 2.50 | 666 | 489 | 4.6 |
| Working Example 4b | 0.20 | 0.80 | 0.35 | 2.15 | 667 | 519 | 4.8 |
| Working Example 5b | 0.34 | 1.80 | 0.40 | 2.50 | 621 | 455 | 3.7 |
| Working Example 6b | 0.35 | 2.00 | 0.41 | 2.55 | 671 | 486 | 3.2 |
| Working Example 7b | 0.30 | 1.80 | 0.32 | 1.65 | 615 | 462 | 4.6 |
| Comparative Example 1b | 0.44 | 2.40 | 0.42 | 2.07 | 475 | 358 | 5.2 |
| Comparative Example 2b | 0.28 | 1.80 | 0.30 | 1.40 | 300 | 230 | 15.0 |
| Comparative Example 3b | 0.28 | 1.80 | 0.30 | 1.40 | 318 | 250 | 13.0 |
| Comparative Example 4b | 0.30 | 1.70 | 0.35 | 2.00 | 510 | 345 | 4.5 |

TABLE 9-continued

Mechanical properties of copper foil

| | After heating | | |
|---|---|---|---|
| | Tensile strength (N/mm²) | 0.2% proof stress (N/mm²) | Elongation (%) |
| Working Example 1b | 525 | 421 | 8.0 |
| Working Example 2b | 292 | 253 | 8.4 |
| Working Example 3b | 412 | 365 | 13.2 |
| Working Example 4b | 413 | 362 | 12.9 |
| Working Example 5b | 323 | 274 | 14.4 |
| Working Example 6b | 328 | 305 | 12.7 |
| Working Example 7b | 377 | 323 | 16.5 |
| Comparative Example 1b | 321 | 250 | 7.8 |
| Comparative Example 2b | 250 | 170 | 5.0 |
| Comparative Example 3b | 240 | 150 | 14.4 |
| Comparative Example 4b | 204 | 102 | 13.8 |

The tensile strength, 0.2% proof stress, and elongation are the values measured using a tensile testing machine (model 1122, manufactured by Instron). The surface roughness values Ra, Rz were measured using a stylus type surface roughness meter (model SE-3C, manufactured by Kosaka Laboratory Ltd.)

Figures 6A, 6B:
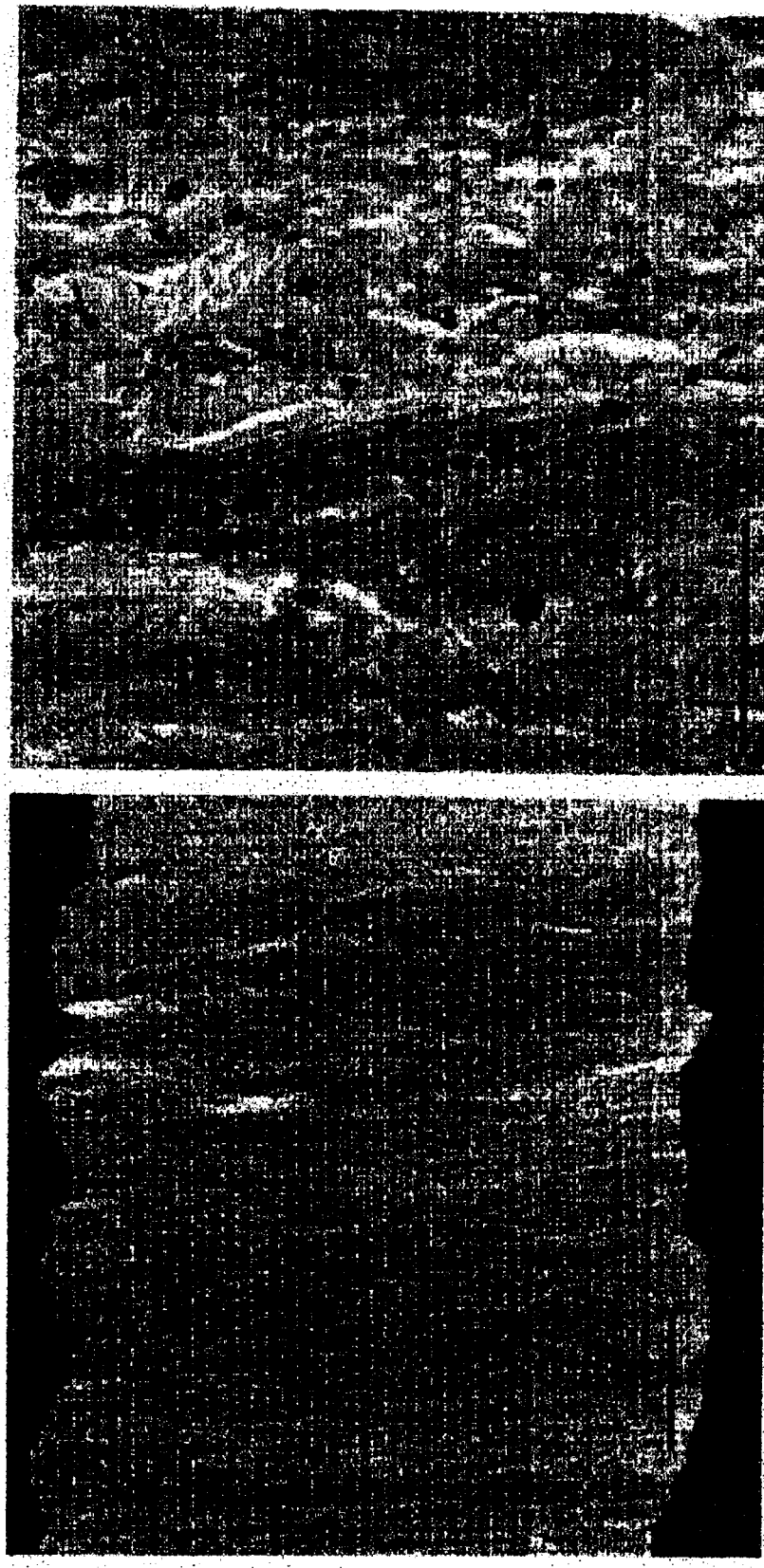
FIGS. 6A and 6B show high sensitivity EELS element analysis (carbon detection).

For each of the working examples and comparative examples produced, the results for the detected content of the Cu component compared with the Cu concentration of the surrounding matrix, as measured from a transmission electron microscope (TEM) image or a scanning transmission electron microscope (STEM) image as shown in FIGS. 6A and 6B are shown in Table 10, and, in addition, the values of the crystal grain diameter obtained from a focused ion beam (FIB) cross-section SIM image, as shown in FIG. 1, are also shown.

TABLE 10

Size of domains with low copper component in the copper foil, number detected, domain EDS element analysis results, and cross-section crystal grain diameter measurement results

| | Precipitated phase or domain | | | | | | |
|---|---|---|---|---|---|---|---|
| Current collector | C approximate dimension nm | Number of C detected No./μm² | Elements detected by mapping analysis | | | | |
| | | | Main | Other 1 | Other 2 | Other 3 | Other 4 | Other 5 |
| Working Example 1b | 5-500 | 20-150 | C | Cl | S | O | Si | Cu |
| Working Example 2b | 3-200 | 100-1500 | C | Cl | S | O | (N) | Cu |
| Working Example 3b | 3-200 | 100-1500 | C | Cl | S | O | (N) | Cu |

TABLE 10-continued

Size of domains with low copper component in the copper foil, number detected, domain EDS element analysis results, and cross-section crystal grain diameter measurement results

| | | | | | | | | |
|---|---|---|---|---|---|---|---|---|
| Working Example 4b | 1-150 | 250-5000 | C | Cl | S | O | (N) | Cu |
| Working Example 5b | 5-500 | 20-150 | C | Cl | S | O | Si | Cu |
| Working Example 6b | 3-200 | 100-1500 | C | Cl | S | O | (N) | Cu |
| Working Example 7b | 1-150 | 250-5000 | C | Cl | S | O | (N) | Cu |
| Comparative Example 1b | 100-700 | 1-5 | C | Cl | S | O | | |
| Comparative Example 2b | 150-1000 | 5-30 | C | Cl | S | O | | |
| Comparative Example 3b | Not clear | Not clear | | | | | | |
| Comparative Example 4b | — | — | | | | | | |

| Current collector | Cross-section crystal grain diameter from SIM image (after heating/nm) Small-Large | |
|---|---|---|
| Working Example 1b | 400 | 2500 |
| Working Example 2b | 350 | 2200 |
| Working Example 3b | 500 | 1800 |
| Working Example 4b | 400 | 1300 |
| Working Example 5b | 200 | 1000 |
| Working Example 6b | 250 | 1000 |
| Working Example 7b | 100 | 1000 |
| Comparative Example 1b | 550 | 3500 |
| Comparative Example 2b | 500 | 8000 |
| Comparative Example 3b | 600 | 5500 |
| Comparative Example 4b | 1000 | 10000 |

Production of Negative Electrodes

Silicon powder with an average particle diameter of 15 μm (purity 99.9%) was used as the negative electrode active material powder, polyimide was used as the binder, the negative electrode active material powder and the binder were added in the proportions 9:1 by weight to N-methyl-2-pyrrolidone and these ingredients were mixed to prepare a negative electrode compound slurry.

Next, the negative electrode compound slurry was applied to the copper foil that was to become the current collector, and dried to form a negative electrode compound layer on both sides of the negative electrode current collector. At this time, the electrode thickness was 85 μm.

Then, after rolling with a roller to an electrode thickness of 60 μm, sintering was carried out at the temperatures shown in Table 8 for one hour in an argon atmosphere to produce the negative electrodes.

Production of Positive Electrodes $Li_2Co_3$ and $CoCo_3$ were used to produce the positive electrode active material, the compounds were weighed to produce an atomic ratio Li:Co of 1:1, then mixed in a mortar, then after pressure forming by pressing in a 17 mm diameter mold, the product was sintered in air at 800° C. for 24 hours to produce an $LiCoO_2$ sintered product, this $LiCoO_2$ sintered product was comminuted in a mortar, to produce an $LiCoO_2$ powder with an average particle diameter of 20 μm.

To 90 parts by weight of the positive electrode active material comprising $LiCoO_2$ powder, N-methyl-2-pyrrolidone solvent of 5% by weight including 5 parts by weight of the conducting agent artificial graphite powder, and 3 parts by weight of the binding agent polyvinylidene fluoride were mixed to prepare the positive electrode compound slurry.

Next, the positive electrode compound slurry was applied to a positive electrode current collector made from 15 μm aluminum foil, dried, and rolled, to produce the positive electrode with the positive electrode compound layer formed on both sides of the positive electrode current collector.

Production Of Non-Aqueous Electrolyte

To produce the non-aqueous electrolyte, $LiPF_6$ was dissolved in a mixed solvent of ethylene carbonate and diethylene carbonate mixed in the proportions 3:7 by volume, to achieve a concentration of 1 mole per liter, in addition, carbon dioxide was blown into the solution for 10 minutes at 25° C., so that the carbon dioxide was dissolved until saturation.

Evaluation of the Battery Charge-Discharge Properties

Lithium-ion secondary batteries were produced using the negative electrodes, the positive electrodes, and the non-aqueous electrolyte as described above, and the charge-discharge properties were evaluated.

To produce the lithium-ion secondary batteries, positive electrode current collection tabs made from aluminum were fitted to the positive electrodes described above, and negative electrode current collection tabs made from nickel were fitted to the negative electrodes described above, the positive electrode and the negative electrode were placed in opposition to each other with a porous separator made from polyethylene disposed therebetween, and wound up to form an electrode body.

Next, the electrode body described above was inserted into an external container made from aluminum laminated film, the non-aqueous electrolyte described above was added to the external container, then the aperture of the external container was closed so that the positive electrode current collection tab and the negative electrode current collection tab were led out.

Next, the lithium-ion secondary batteries of Working Examples 1b to 7b and Comparative Examples 1b to 4b produced as described above were charged to 4.2 V at a current value of 1000 mA in a 25° C. environment, then discharged to 2.75 V at a current value of 1000 mA, and taking this to be one cycle, charging and discharging was repeated, and the number of cycles was measured until the discharge capacity reached 70% of the discharge capacity of the first cycle, and this number was taken to be the cycle life. The results are shown in Table 11, taking the cycle life of the lithium-ion secondary battery of Working Example 1b to be an index of 100.

Also, after cycling, each lithium battery according to Working Examples 1b to 10b and Comparative Examples 1b to 4b was dismantled, and the negative electrode current collector of each negative electrode was checked for the occurrence of creasing, and the results are also shown in Table 11.

TABLE 11

Discharge capacity retention ratio and occurrence of creasing

| | Discharge capacity retention ratio S surface (%) | Discharge capacity retention ratio M surface (%) | Occurrence of creasing |
|---|---|---|---|
| Working Example 1b | 77 | 78 | Absent |
| Working Example 2b | 57 | 58 | Absent |
| Working Example 3b | 63 | 65 | Absent |
| Working Example 4b | 63 | 66 | Absent |
| Working Example 5b | 61 | 61 | Absent |
| Working Example 6b | 61 | 62 | Absent |
| Working Example 7b | 59 | 59 | Absent |
| Comparative Example 1b | 45 | 47 | Present |
| Comparative Example 2b | 37 | 41 | Present |
| Comparative Example 3b | 48 | 45 | Absent |
| Comparative Example 4b | 54 | 53 | Absent |

As shown in Table 11, in Working Examples 1b to 7b of the present invention, the copper foil has a precipitated phase or domains of from 1 to 500 nm in size in which the detected content of Cu component is low compared with the Cu concentration of the surrounding matrix, when observed on a transmission electron microscope (TEM) image or on a scanning transmission electron microscope (STEM) image, as shown in FIG. 6.

It has been confirmed that by using copper foil that includes domains whose Cu concentration is low compared with the surroundings and whose main component is carbon (C), and, in addition, includes sulfur (S), chlorine (Cl), or nitrogen (N), a reduction in capacity due to repeated charge-discharge cycling did not occur, and, the occurrence of creases in the current collector due to charging and discharging was suppressed.

The surrounding matrix refers to the part of surrounding black dots shown in FIG. 4.

When copper foil that has a 0.2% proof stress of 250 N/mm$^2$ or more after heat treatment at from 200 to 400° C. for 30 minutes to 1.5 hours was used, reduction in capacity due to repeated charge-discharge cycling did not occur, and, it was possible to suppress the occurrence of creases in the current collector due to charging and discharging.

In addition, when copper foil having a crystal grain diameter observed in cross-section in the copper foil thickness direction on a SIM image in the range of from 20 to 3500 nm was used in the current collector, reduction in capacity due to repeated charge-discharge cycling did not occur, and it was possible to suppress the occurrence of creases in the current collector due to charging and discharging.

Comparative Example 1b was an example in which the electrolytic copper foil as disclosed in Patent Document 1 (Japanese Patent No. 3742144) was used as the current collector, but, before and after heat treatment, the 0.2% proof stress was comparatively high but was 250 N/mm$^2$ or less, and, after repeated charging and discharging, creases occurred on the current collector.

In addition, Comparative Examples 2b to 4b were foil with comparatively high tensile strength but low 0.2% proof stress at room temperature, that softened after heat treatment, so the 0.2% proof stress was low, so creases occurred in the current collector due to repeated charging and discharging.

As described above, using copper foil according to the embodiment of the present invention, when a negative electrode current collector that has been rust-proofed on at least one side thereof is used, it is possible to suppress the occurrence of deformation such as creases or the like on the current collector due to charging and discharging, and possible to prevent short circuits between the positive electrode and the negative electrode of the lithium-ion secondary battery, so it is possible to provide a lithium-ion secondary battery whose capacity does not reduce due to repeated charge-discharge cycling, that has a long life, and that can be reduced in size.

The embodiment of the present invention has been explained for the case where the active material is silicon, but even when an active material whose main component is a silicon oxide, carbon, or tin is used, it is possible to provide a lithium-ion secondary battery that suppresses the occurrence of deformation such as creases and the like due to charging and discharging, prevents short circuits between the positive electrode and the negative electrode of the lithium-ion secondary battery, and for which there is no reduction of the capacity retention ratio due to repeated charge-discharge cycling, that has long life, and can be reduced in size.

The copper foil according to the embodiment of the present invention is effective when laminated onto a rigid or a flexible insulating board, and used as a printed circuit board.

The invention claimed is:

1. An electrolytic copper foil for a negative electrode current collector of a lithium-ion secondary battery constituting the negative electrode current collector for the lithium-ion secondary battery, the electrolytic copper foil having a surface roughness Rz of from 0.8 to 2.8 μm on both a first surface and a second surface thereof, the electrolytic copper foil having a 0.2% proof stress after heat treatment under a temperature between 200 and 400° C. of 250 N/mm$^2$ or more and an elongation of 2.5% or more, and at least one of the first surface and the second surface of the electrolytic copper foil on which an active material layer is provided being rust-proofed.

2. An electrolytic copper foil for a negative electrode current collector for a lithium-ion secondary battery constituting the negative electrode current collector for the lithium-ion secondary battery, the electrolytic copper foil having a surface roughness Rz of from 0.8 to 2.8 μm on both a first surface and a second surface thereof, the electrolytic copper foil having a 0.2% proof stress of 250 N/mm$^2$ or more and an elongation of 2.5% or more after heat treatment under a temperature between 200 and 400° C., and at least one of the first surface and the second surface of the electrolytic copper foil on which an active material layer is provided being roughened and rust-proofed.

3. The electrolytic copper foil according to claim 2, wherein the at least one of the first surface and the second surface is roughened by attaching particles whose main component is Cu using a plating method.

4. The electrolytic copper foil according to claim 2, wherein the at least one of the first surface and the second surface includes a granular copper plating layer formed by burn plating of copper and a precise copper plating (cover plating) formed on the granular copper plating layer.

5. The electrolytic copper foil according to claim 2, wherein the at least one of the first surface and the second surface is roughened by an etching method.

6. A negative electrode for a lithium-ion secondary battery, the negative electrode including a current collector formed of an electrolytic copper foil, the electrolytic copper foil having a surface roughness Rz of from 0.8 to 2.8 μm on both a first surface and a second surface thereof, the electrolytic copper foil having a 0.2% proof stress of 250 N/mm$^2$ or more and an elongation of 2.5% or more after heat treatment under a temperature between 200 and 400° C., at least one of the first surface and the second surface being rust-proofed, and an active material layer being formed on the at least one of the first surface and the second surface that has been rust-proofed.

7. A negative electrode for a lithium-ion secondary battery, the negative electrode including a current collector formed of an electrolytic copper foil, the electrolytic copper foil having a surface roughness Rz of from 0.8 to 2.8 μm on both a first surface and a second surface thereof, the electrolytic copper foil having a 0.2% proof stress of 250 N/mm$^2$ or more and an elongation of 2.5% or more after heat treatment under a temperature between 200 and 400° C., at least one of the first surface and the second surface being roughened and rust-proofed, and an active material layer being formed on the at least one of the first surface and the second surface that has been rust-proofed.

8. The negative electrode according to claim 6 or 7, wherein the active material layer is applied to the negative electrode current collector as a slurry of kneaded active material, binder, and solvent, and being dried and pressed.

9. The negative electrode according to claim 6 or 7, wherein the active material layer is formed from an active material whose main component is carbon, silicon, germanium, or tin.

10. A lithium-ion secondary battery comprising a positive electrode and a negative electrode, the negative electrode including a current collector formed of an electrolytic copper foil, the electrolytic copper foil having a surface roughness Rz of from 0.8 to 2.8 μm on both a first surface and a second surface thereof, the electrolytic copper foil having a 0.2% proof stress of 250 N/mm$^2$ or more and an elongation of 2.5% or more after heat treatment under a temperature between 200 and 400° C., at least one of the first surface and the second surface being rust-proofed, and an active material layer being formed on the at least one of the first surface and the second surface that has been rust-proofed.

11. A lithium-ion secondary battery comprising a positive electrode and a negative electrode, the negative electrode including a current collector formed of an electrolytic copper foil, the electrolytic copper foil having a surface roughness Rz of from 0.8 to 2.8 μm on both a first surface and a second surface thereof, the electrolytic copper foil having a 0.2% proof stress of 250 N/mm$^2$ or more and an elongation of 2.5% or more after heat treatment under a temperature between 200 and 400° C., at least one of the first surface and the second surface being roughened and rust-proofed, and an active material layer being formed on the at least one of the first surface and the second surface that has been rust-proofed.

* * * * *